United States Patent
Kim et al.

(10) Patent No.: US 12,419,140 B2
(45) Date of Patent: Sep. 16, 2025

(54) UV LIGHT EMITTING DIODE

(71) Applicant: SEOUL VIOSYS CO., LTD., Gyeonggi-do (KR)

(72) Inventors: Tae Gyun Kim, Gyeonggi-do (KR); Seon Min Bae, Gyeonggi-do (KR); Seom Geun Lee, Gyeonggi-do (KR); Kyu Ho Lee, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 546 days.

(21) Appl. No.: 17/743,993

(22) Filed: May 13, 2022

(65) Prior Publication Data
US 2022/0367753 A1 Nov. 17, 2022

Related U.S. Application Data

(60) Provisional application No. 63/189,411, filed on May 17, 2021.

(51) Int. Cl.
*H10H 20/819* (2025.01)
*H10H 20/825* (2025.01)
(Continued)

(52) U.S. Cl.
CPC ........ *H10H 20/819* (2025.01); *H10H 20/825* (2025.01); *H10H 20/8312* (2025.01); *H10H 20/857* (2025.01)

(58) Field of Classification Search
CPC ....... H01L 33/20; H01L 33/32; H01L 33/382; H01L 33/62
(Continued)

(56) References Cited

U.S. PATENT DOCUMENTS

2005/0179130 A1* 8/2005 Tanaka ................ H01L 21/0237
257/730
2013/0069079 A1 3/2013 Kim
(Continued)

FOREIGN PATENT DOCUMENTS

| CN | 112635628 A | 4/2021 |
| KR | 20060030636 A | 4/2006 |

(Continued)

OTHER PUBLICATIONS

English Translation of the International Search Report for PCT/KR2022/007033, Aug. 29, 2022, 2 pages.
(Continued)

*Primary Examiner* — Norman D Richards
*Assistant Examiner* — Laura M Dykes
(74) *Attorney, Agent, or Firm* — LaBatt, LLC

(57) ABSTRACT

A UV light emitting diode includes a substrate having a plurality of holes surrounded by a flat surface, a first conductivity type semiconductor layer disposed on the substrate, a second conductivity type semiconductor layer disposed on the first conductivity type semiconductor layer, an active layer disposed between the first conductivity type semiconductor layer and the second conductivity type semiconductor layer. A distance from the flat surface to the active layer is smaller than a distance from bottom surfaces of the plurality of holes to the active layer. The flat surface is in contact with the first conductivity type semiconductor layer.

20 Claims, 24 Drawing Sheets

(51) Int. Cl.
H10H 20/831 (2025.01)
H10H 20/857 (2025.01)

(58) Field of Classification Search
USPC .......................................................... 257/79
See application file for complete search history.

(56) References Cited

U.S. PATENT DOCUMENTS

| | | |
|---|---|---|
| 2016/0056352 A1* | 2/2016 | Koike .................... H01L 33/22 |
| | | 438/27 |
| 2016/0149079 A1 | 5/2016 | Koike |
| 2017/0104130 A1 | 4/2017 | Lopez |
| 2017/0287698 A1* | 10/2017 | Jain .................... H01L 21/0242 |
| 2017/0288088 A1 | 10/2017 | Won Cheol |
| 2018/0315887 A1 | 11/2018 | Choi et al. |
| 2018/0323343 A1 | 11/2018 | Jang et al. |
| 2018/0351042 A1 | 12/2018 | Jang et al. |

FOREIGN PATENT DOCUMENTS

| | | |
|---|---|---|
| KR | 20120139855 A | 12/2012 |
| KR | 20160002973 A | 1/2016 |
| KR | 20170094679 A | 8/2017 |
| KR | 20180122215 A | 11/2018 |
| WO | WO-2019113814 A1 * | 6/2019 |

OTHER PUBLICATIONS

Extended European Search Report for European Patent Application No. 22804950.8, Apr. 7, 2025, 9 pages.

* cited by examiner

UV LIGHT EMITTING DIODE

CROSS-REFERENCE OF RELATED APPLICATIONS AND PRIORITY

The present application is a non-provisional applications claiming priority to and benefit of U.S. Provisional Application No. 63/189,411 filed May 17, 2021, the disclosure of which is incorporated by reference as if fully set forth herein.

TECHNICAL FIELD

The present disclosure relates to an inorganic semiconductor light emitting diode, and more particularly, to a light emitting diode emitting UV light of 300 nm or less.

BACKGROUND

In general, a light emitting diode emitting UV light within a range of 200 nm to 300 nm can be used in various applications, including a sterilization device, a water or an air purification device, a high-density optical recording device, and an excitation source for a bio-aerosol fluorescence detection system.

Unlike a near-UV light emitting diode or a blue light emitting diode, a light emitting diode that emits relatively more UV light includes a well layer containing Al, such as AlGaN. Due to a composition of this gallium nitride-based semiconductor layer, a UV light emitting diode has a structure significantly different from that of the blue light emitting diode.

In particular, for the blue light emitting diode, a patterned sapphire substrate is generally used as a growth substrate. A light extraction efficiency of the light emitting diode may be increased by a pattern formed on the sapphire substrate. For the UV light emitting diode, it is necessary to grow a semiconductor layer having a high Al content, such as AlGaN, which does not grow with a good crystal quality on a conventional patterned sapphire substrate, unlike the semiconductor layer used in the blue light emitting diode.

Accordingly, the conventional UV light emitting diode has been generally manufactured using a sapphire substrate having a flat growth surface, and thus, there is a limit in increasing the light extraction efficiency. Moreover, the conventional UV light emitting diode does not have a favorable crystal quality, and thus, a performance thereof may be easily deteriorated with prolonged use.

DETAILED DESCRIPTION OF THE DISCLOSURE

Technical Problem

Exemplary embodiments of the present disclosure provide a UV light emitting diode with an improved light extraction efficiency.

Exemplary embodiments of the present disclosure provide a UV light emitting diode with a decreased performance degradation even it is used for a long time.

Technical Solution

A UV light emitting diode according to an exemplary embodiment of the present disclosure includes a substrate having a plurality of holes surrounded by a flat surface, a first conductivity type semiconductor layer disposed on the substrate, a second conductivity type semiconductor layer disposed on the first conductivity type semiconductor layer, an active layer disposed between the first conductivity type semiconductor layer and the second conductivity type semiconductor layer. A distance from the flat surface to the active layer is smaller than a distance from bottom surfaces of the plurality of holes to the active layer, and the flat surface is in contact with the first conductivity type semiconductor layer.

Diameters of inlets of the holes may be less than 1 µm, and diameters of the bottom surfaces of the holes may be 500 nm or less.

The diameters of the inlets of the holes may be in a range of 500 nm to 700 nm.

Furthermore, a distance between centers of adjacent holes may be 1 µm or more and 3 µm or less.

In an exemplary embodiment, the holes may be arranged in a honeycomb shape.

The first conductivity type semiconductor layer may include a plurality of cavities therein, and the plurality of cavities may be disposed on the holes, corresponding to the holes.

Furthermore, the first conductivity type semiconductor layer may include an AlN layer, and the cavities may be formed in the AlN layer.

The UV light emitting diode may further include: an n-ohmic contact layer contacting the first conductivity type semiconductor layer; a p-ohmic contact layer contacting the second conductivity type semiconductor layer; an n-pad metal layer electrically connected to the n-ohmic contact layer; a p-pad metal layer electrically connected to the p-ohmic contact layer; an n-bump electrically connected to the n-pad metal layer; and a p-bump electrically connected to the p-pad metal layer, in which the p-pad metal layer may be formed so as to surround the n-pad metal layer.

The n-bump and the p-bump are disposed in a region over the second conductivity type semiconductor layer.

The UV light emitting diode may further include a lower insulation layer covering the p-ohmic contact layer and the n-ohmic contact layer, in which the lower insulation layer may have openings exposing the p-ohmic contact layer and the n-ohmic contact layer, and the n-pad metal layer and the p-pad metal layer may be electrically connected to the n-ohmic contact layer and the p-ohmic contact layer through the openings of the lower insulation layer, respectively.

The UV light emitting diode may further include an upper insulation layer covering the n and p-pad metal layers, in which the upper insulation layer may have openings exposing the n-pad metal layer and the p-pad metal layer, wherein the n-bump and the p-bump may be disposed on the upper insulation layer, and may be electrically connected to the n-pad metal layer and the p-pad metal layer through the openings of the upper insulation layer.

In the UV light emitting diode according to an exemplary embodiment of the present disclosure, a peak wavelength of an emission spectrum is 280 nm or less, and after driving at room temperature for 1000 hours, a light output is 85% or more compared to an initial light output.

In some exemplary embodiments, the light output of the UV light emitting diode after driving at room temperature for 1000 hours may be greater than or equal to 90% of the initial light output.

The UV light emitting diode may include a substrate, a first conductivity type semiconductor layer disposed on the substrate, an active layer disposed on the first conductivity type semiconductor layer, a second conductivity type semiconductor layer disposed on the active layer, an n-ohmic contact layer contacting the first conductivity type semiconductor layer, a p-ohmic contact layer contacting the second conductivity type semiconductor layer, an n-bump electrically connected to the n-ohmic contact layer, and a p-bump electrically connected to the p-ohmic contact layer, in which the substrate may have a hole pattern.

Furthermore, the first conductivity type semiconductor layer may include an AlN layer, and the AlN layer may have a plurality of cavities therein. The plurality of cavities may be disposed on the holes corresponding to the holes of the hole pattern.

A portion of the cavities may be disposed in the holes.

The second conductivity type semiconductor layer may include a p-type GaN layer, in which the p-type GaN layer may have a thickness of 50 nm or less, and the p-ohmic contact layer may be in-ohmic contact with the p-type GaN layer.

The UV light emitting diode may further include an upper insulation layer covering the n-pad metal layer and the p-pad metal layer. The upper insulation layer may have openings exposing the n-pad metal layer and the p-pad metal layer, and the n-bump and the p-bump may be electrically connected to the n-pad metal layer and the p-pad metal layer through the openings of the upper insulation layer, respectively.

In addition, the upper insulation layer may cover side surfaces of the second conductivity type semiconductor layer and the active layer.

The opening exposing the n-pad metal layer may be disposed near one edge of a mesa, and the opening exposing the p-pad metal layer may be disposed near an opposite edge of the mesa.

Advantageous Effects

According to exemplary embodiments of the present disclosure, it is possible to provide a UV light emitting diode with improved light output and reliability by making a distance from a flat surface of a substrate to an active layer smaller than a distance from bottom surfaces of a plurality of holes to the active layer. In addition, it is possible to provide a UV light emitting diode with improved light output and reliability using holes having a size of 1 μm or less.

BRIEF DESCRIPTION OF DRAWINGS

FIG. 4A illustrates forming a hole pattern on an upper surface of a substrate;

FIG. 4B is a cross-sectional view of FIG. 4A along line A-A';

FIG. 5A illustrates growing a first conductivity type semiconductor layer, an active layer, and a second conductivity type semiconductor layer on the substrate;

FIG. 5B illustrates a cross-sectional view of FIG. 5A along line A-A';

FIG. 6A illustrates forming n-ohmic contact layers on bottom surfaces of via holes;

FIG. 6B illustrates a cross-sectional view of FIG. 6A along line A-A';

FIG. 7A illustrates forming a p-ohmic contact layer on the mesa after the n-ohmic contact layer is formed;

FIG. 7B illustrates a cross-sectional view of FIG. 7A along line A-A';

FIG. 8A illustrates forming a lower insulation layer on the mesa M;

FIG. 8B illustrates a cross-sectional view of FIG. 8A along line A-A';

FIG. 9A illustrates forming an n-pad metal layer and a p-pad metal layer on the lower insulation layer;

FIG. 9B illustrates a cross-sectional view of FIG. 9A;

FIG. 10A illustrates forming an upper insulation layer on the n-pad metal layer and the p-pad metal layer;

FIG. 10B illustrates a cross-sectional view of FIG. 10A along line A-A';

FIG. 11A illustrates forming an n-bump and a p-bump on the upper insulation layer; and FIG. 11B illustrates a cross-sectional view of FIG. 11A along line A-A'.

FIG. 13A illustrates growing a first conductivity type semiconductor layer, an active layer, and a second conductivity type semiconductor layer on a substrate.

FIG. 13B is a cross-sectional view of FIG. 13A along line B-B'.

FIG. 14A illustrates forming n-ohmic contact layers on the first conductivity type semiconductor layer;

FIG. 14B illustrates a cross-sectional view of FIG. 14A along line B-B';

FIG. 15A illustrates after the n-ohmic contact layers 131a and 131b are formed, forming a p-ohmic contact layer on the mesa;

FIG. 15B is a cross-sectional view of FIG. 15A along line B-B';

FIG. 16A illustrates carrying out an isolation process for dividing the first conductivity type semiconductor layer 123;

FIG. 16B is a cross-sectional view of FIG. 16A along line B-B';

FIG. 17A illustrates forming an n-capping layer and a p-capping layer;

FIG. 17B is a cross-sectional view of FIG. 17A along line B-B';

FIG. 18A illustrates forming a lower insulation layer covering the mesa M;

FIG. 18B is a cross-sectional view of FIG. 18A along line B-B';

FIG. 19A illustrates forming an n-pad metal layer and a p-pad metal layer on the lower insulation layer;

FIG. 19B is a cross-sectional view of FIG. 19A along line B-B';

FIG. 20A illustrates forming an upper insulation layer on the n-pad metal layer and the p-pad metal layer; and FIG. 20B is a cross-sectional view of FIG. 20A along line B-B'.

DETAILED DESCRIPTION OF THE ILLUSTRATED EMBODIMENTS

Figure 1A:
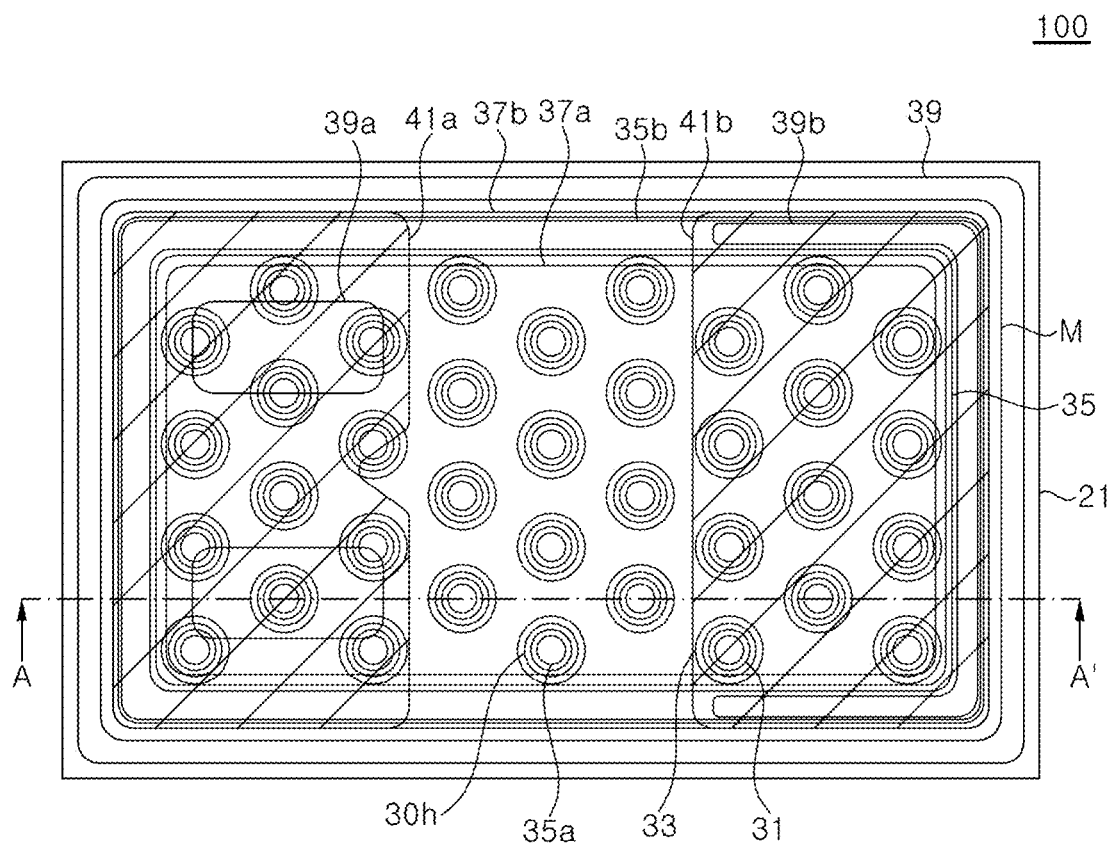
FIG. 1A is a schematic plan view illustrating a UV light emitting diode according to an exemplary embodiment of the present disclosure.

Hereinafter, exemplary embodiments will be described in detail with reference to the accompanying drawings. The following exemplary embodiments are provided by way of example so as to fully convey the spirit of the present disclosure to those skilled in the art to which the present disclosure pertains. Accordingly, the present disclosure should not be limited to the specific disclosed forms, and be construed to include all modifications, equivalents, or replacements included in the spirit and scope of the present disclosure. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

Nitride-based semiconductor layers described below may be grown using generally known various methods, and may be grown using technology, for example, metal organic chemical vapor deposition (MOCVD), molecular beam epitaxy (MBE), hydration vapor phase epitaxy (HVPE), or the like. However, in exemplary embodiments described below, it is described that semiconductor layers are grown in a growth chamber using the MOCVD. In a process of growing the nitride-based semiconductor layers, sources introduced into the growth chamber may be generally known sources, for example, TMGa, TEGa, or the like may be used as a Ga source, TMAl, TEAl, or the like may be used as an Al source, TMIn, TEIn, or the like may be used as an In source, and $NH_3$ may be used as a N source. However, the inventive concepts are not limited thereto.

Figure 1B:
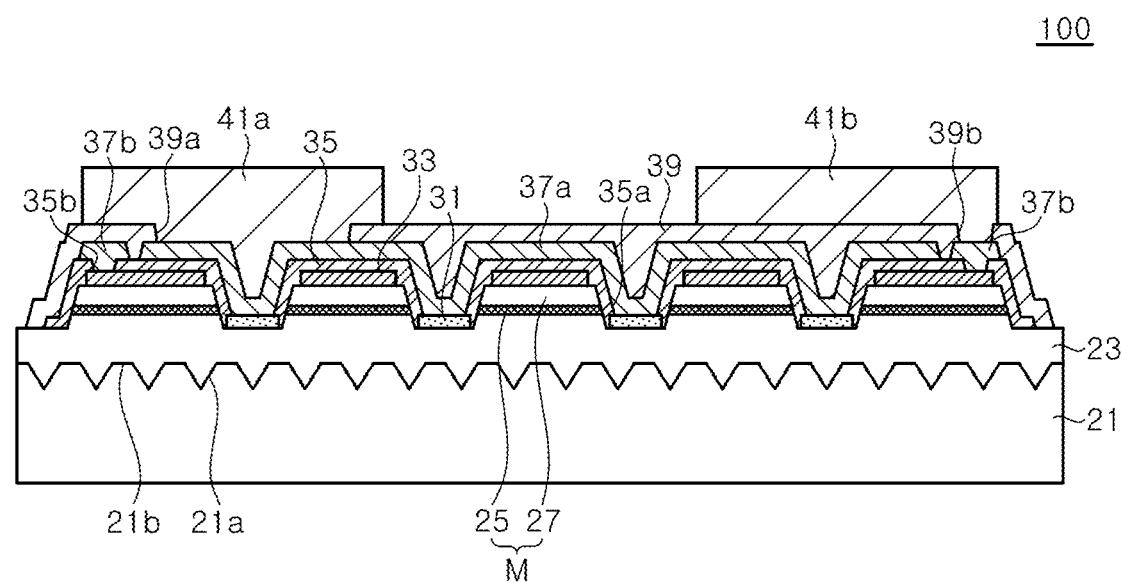
FIG. 1B is a schematic cross-sectional view taken along line A-A' of its corresponding plan view shown in FIG. 1A.
Figure 2A:
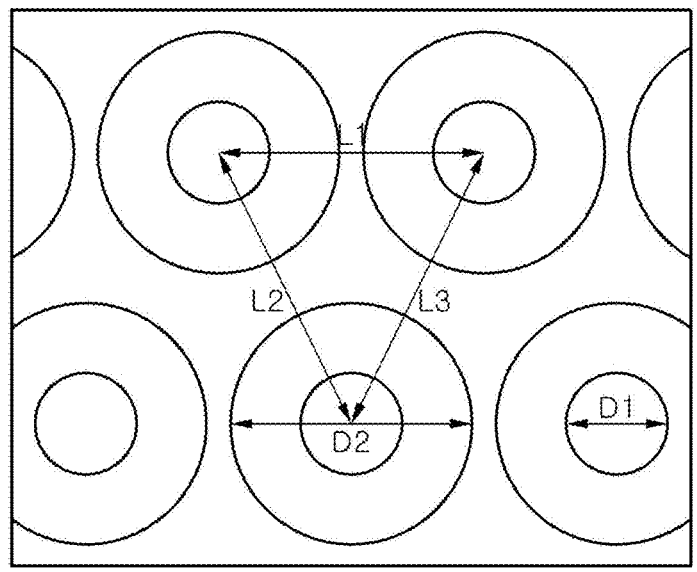
FIG. 2A is a schematic plan view illustrating a hole pattern formed on a substrate.
Figure 2B:
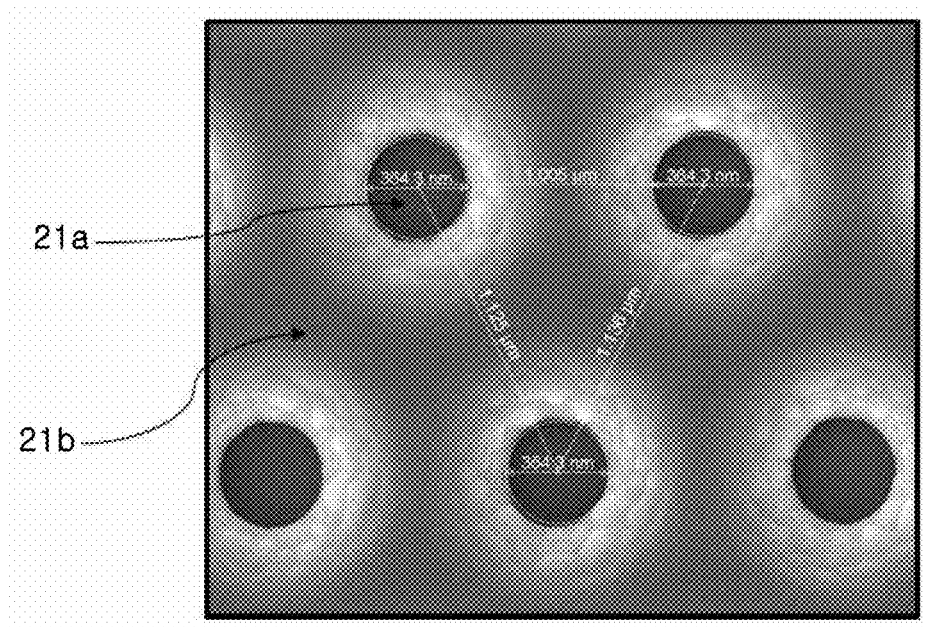
FIG. 2B is a planar SEM image showing the hole pattern formed on the substrate according to an exemplary embodiment.
Figure 2C:
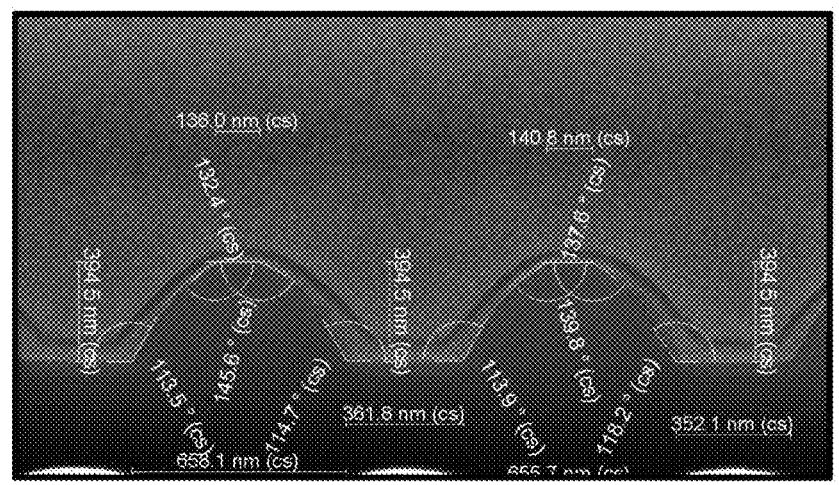
FIG. 2C is a cross-sectional SEM image showing the hole pattern formed on the substrate, according to an exemplary embodiment.
Figure 3A:
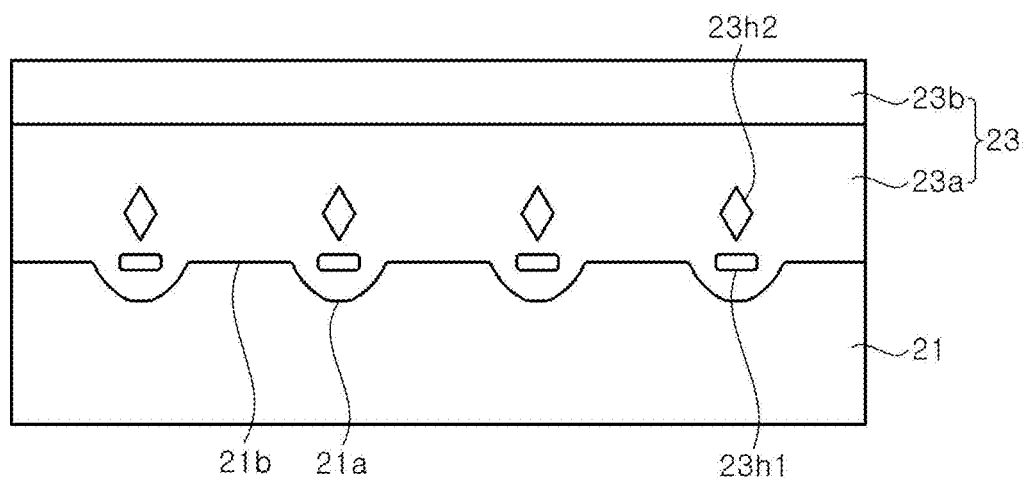
FIG. 3A is a schematic cross-sectional view illustrating a first conductivity type semiconductor layer formed on the substrate.
Figure 3B:
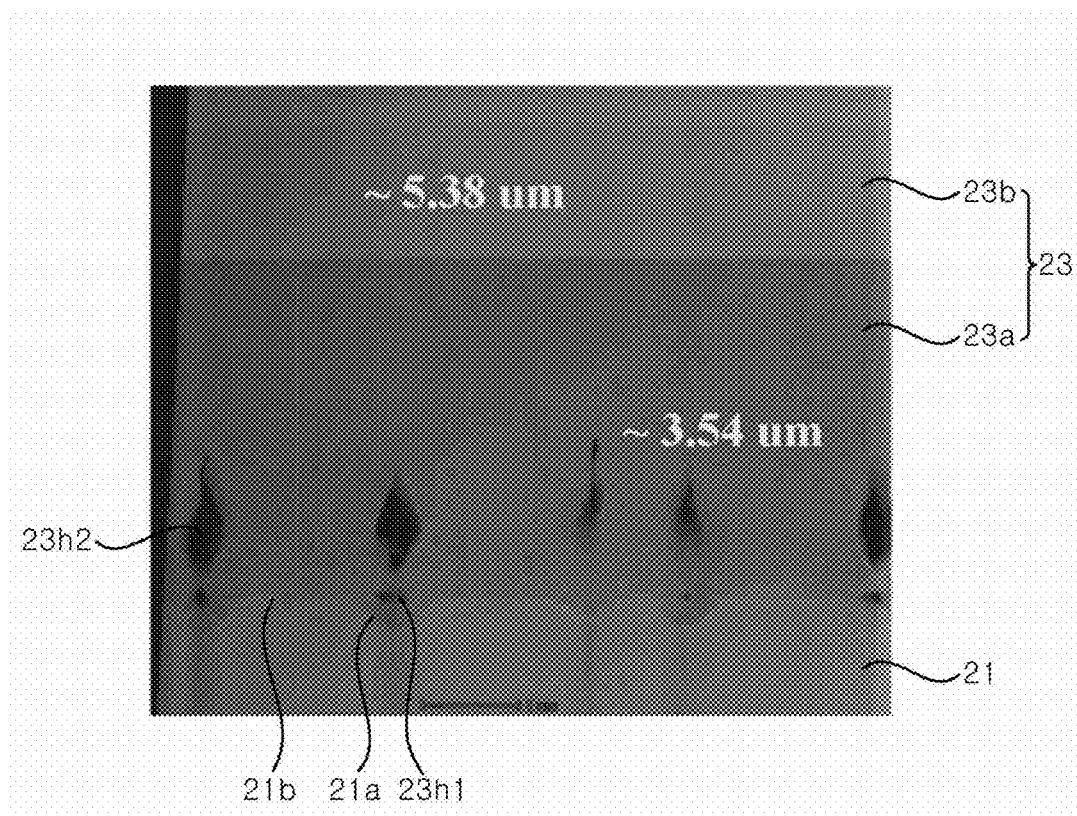
FIG. 3B is a cross-sectional TEM image showing the first conductivity type semiconductor layer formed on the substrate according to an exemplary embodiment of the present disclosure.
Figure 3C:
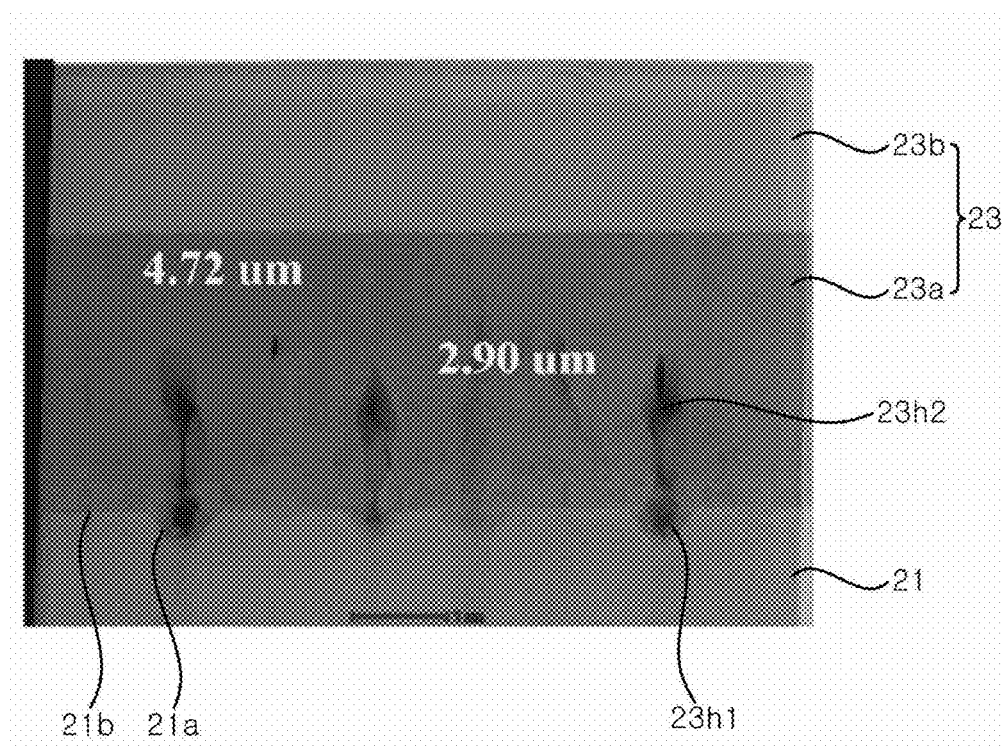
FIG. 3C is a cross-sectional TEM image showing a first conductivity type semiconductor layer formed on the substrate according to another exemplary embodiment of the present disclosure.

FIG. 1A is a schematic plan view illustrating a UV light emitting diode 100 according to an exemplary embodiment of the present disclosure, and FIG. 1B is a schematic cross-sectional view taken along line A-A' of its corresponding plan view shown in FIG. 1A. Meanwhile, FIG. 2A is a schematic plan view illustrating a hole pattern formed on a substrate, FIG. 2B is a planar SEM image showing the hole pattern formed on the substrate, according to an exemplary embodiment, and FIG. 2C is a cross-sectional SEM image showing the hole pattern formed on the substrate, according to an exemplary embodiment. In addition, FIG. 3A is a schematic cross-sectional view illustrating a first conductivity type semiconductor layer formed on the substrate, FIG. 3B is a cross-sectional TEM image showing the first conductivity type semiconductor layer formed on the substrate according to an exemplary embodiment of the present disclosure, and FIG. 3C is a cross-sectional TEM image showing a first conductivity type semiconductor layer formed on the substrate according to another exemplary embodiment of the present disclosure.

Referring to FIG. 1A and FIG. 1B, the UV light emitting diode 100 according to the illustrated exemplary embodiment may include a substrate 21, a first conductivity type semiconductor layer 23, an active layer 25, a second conductivity type semiconductor layer 27, an n-ohmic contact layer 31, a p-ohmic contact layer 33, a lower insulation layer 35, an n-pad metal layer 37a, a p-pad metal layer 37b, an upper insulation layer 39, an n-bump 41a, and a p-bump 41b.

The substrate 21 is not particularly limited as long as it is a substrate capable of growing a nitride-based semiconductor, and may include, for example, a heterogeneous substrate such as a sapphire substrate, a silicon substrate, a silicon carbide substrate, a spinel substrate, or the like. In particular, the substrate 21 may be a sapphire substrate.

The substrate 21 is relatively thick compared to a substrate used in a blue light emitting diode, and for example, it may have a thickness of 200 μm or more, furthermore, 400 μm or more. An upper limit of the thickness of the substrate 21 is not particularly limited, but the upper limit of the thickness may be, for example, 800 μm or less. By using the relatively thick substrate 21, an amount of ultraviolet rays emitted to the outside may be increased.

As shown in FIG. 1B, the substrate 21 may have a hole pattern including a plurality of holes 21a formed on a flat surface 21b. The flat surface 21b provides a growth site for a nitride semiconductor layer.

The hole pattern of the illustrated exemplary embodiment is different in size from a pattern on a sapphire substrate patterned according to the prior art. The pattern according to the prior art includes a bottom surface and a protrusion, in which the bottom surface provides a main growth site, and a growth layer is merged on the protrusion. In contrast, in the illustrated exemplary embodiment, in the nitride semiconductor layer, the flat surface 21b provides a main growth site, and a growth layer is merged on the holes 21a.

As shown in FIG. 2A, the holes 21a are spaced apart from one another, and the flat surface 21b is interposed between the holes 21a. A minimum width of the flat surface 21b interposed between the holes 21a may be 100 nm or more, further, 200 nm or more. The holes 21a may be arranged, for example, in a honeycomb shape, without being limited thereto. In addition, distances L1, L2, and L3 between adjacent holes 21a may be identical in any direction, but the inventive concepts are not limited thereto. For example, L1 may be smaller compared to L2 and L3. A minimum distance L1 between centers of the adjacent holes 21a may be 1 μm or more, and may be 3 μm or less. When the distance between the centers of the holes 21a is less than 1 μm, it is difficult to grow the nitride semiconductor layer, and when it exceeds 3 μm, an effect of introducing the hole pattern is lowered, which is not preferable.

The hole 21a may include an inclined surface and a bottom surface. As shown in FIG. 2A, the bottom surface of the hole 21a may be formed to have a diameter D1, and an inlet of the hole 21a may be formed to have a diameter D2. A region between the diameters D1 and D2 is an inclined surface, and growth of the nitride semiconductor layer on the inclined surface is limited. Meanwhile, the diameter D1 of the bottom surface of the hole 21a may have a size of 500 nm or less, and further may have a size of 400 nm or less. For example, the diameter D1 of the bottom surface of the hole 21a may be about 300 nm to about 400 nm. However, the inventive concepts are not limited thereto, and there may be no flat bottom surface. That is, the diameter D1 may be 0 nm. The diameter D2 may be less than 1 μm, and further may be 700 nm or less. For example, the diameter D2 may be in a range of about 500 nm to about 700 nm. The inclined surface may be formed as a curved surface, and may be a convex curved surface or a concave curved surface in a direction of a central axis of the hole 21a. In addition, the inclined surface may be disposed between the flat surface 21b of the substrate and a light exiting surface that is disposed opposite to the flat surface 21b and emits light to the outside. However, the present disclosure is not limited to a specific shape of the inclined surface.

By limiting the size of the hole 21a to 1 μm or less, a crystal layer grown on the flat surface 21b may be merged over the holes 21a. The crystal layer may also be grown on the bottom surface of the hole 21a, but this layer is limited in the hole 21a. Accordingly, as shown in FIG. 3A, cavities 23h1 and 23h2 may be formed over the holes 21a.

The patterned sapphire substrate of the prior art includes protrusions spaced apart from one another in an island type, and has a structure in which the protrusions are surrounded by concave portions. In a case of a blue light emitting diode, semiconductor layers can be grown using the concave portions as a growth surface, but in a case of a deep UV light emitting diode, in a conventional patterned sapphire substrate, the crystal layers do not grow well in the concave portion and the crystal layers are not merged well. Thus, many defects such as high density dislocations in the grown nitride semiconductor layers remain.

On the contrary, according to the illustrated exemplary embodiment, by forming the holes 21a having a small size of less than 1 μm on the upper surface of the substrate 21 and using the flat surface 21b as the growth surface, it is possible to grow the nitride semiconductor layer for the UV light emitting diode, and to achieve the merge of the crystal layers. Accordingly, the UV light emitting diode may be manufactured using the nitride semiconductor layer having favorable crystal quality. Furthermore, a light extraction efficiency may be improved by using the hole pattern formed on the substrate 21.

In addition, a height level of the flat surface 21b used as the growth surface in the present disclosure is higher than that of a flat surface used as the growth surface in the conventional patterned sapphire substrate. In the present disclosure, as the hole may not be completely filled, a semiconductor layer having a high Al content may be easily formed, and it is effective to form the semiconductor layer for the UV light emitting diode with improved crystallinity.

In particular, even when the Al content is high, crystal growth is preferentially achieved on the flat surface, thereby improving the crystallinity and thus, a reduction rate of luminous intensity may be decreased even when the light emitting diode is driven for a long time.

In addition, in the patterned sapphire substrate of the prior art, there is a high possibility that light generated from an active layer is first incident on a surface of the protrusion, and scattering and re-incident into the semiconductor layer due to the curved surface of the protrusion, and thus, the light extraction efficiency may be reduced. However, in a structure of the present disclosure, since there is a high possibility that light generated from the active layer is incident on the flat surface rather than the curved surface of the hole, scattering of light is reduced by the flat surface and the possibility of light entering the inside of the substrate increases, and thus, the light extraction efficiency is increased. Accordingly, as a thickness of the substrate increases in the UV light emitting diode, an amount of light entering the substrate increases, and thus, the luminous intensity may be improved.

In addition, the substrate 21 may have a width (a), a length (b), and a thickness (h), and a luminous density of UV light emitted through the substrate 21 may be increased. A value of the luminous density may be defined as a luminous density $(mW/mm^2 \cdot mA)$=luminous intensity (mW)/(emission area $(mm^2) \times current$ (mA)), in which the emission area $(mm^2)$ may be defined as $(a \cdot b)+2 \ h \cdot (a+b)$. Therefore, in a case of a UV light emitting diode having a width of 0.95 mm, a length of 0.6 mm, and a thickness of 0.4 mm, the luminous density $(mW/mm^2 \cdot mA)$ may be 0.083 or more.

The first conductivity type semiconductor layer 23 is disposed on the substrate 21. The first conductivity type semiconductor layer 23 may include, for example, a buffer layer (23a of FIG. 3A) and an n-type AlGaN layer (23b of FIG. 3A). The buffer layer 23a may have a thickness of 2 μm or more, may have a thickness of about 5 μm or less, and an AlN material may be used. In an exemplary embodiment, a first AlGaN layer may include a lower n-type AlGaN layer (about 2.15 μm) with an Al molar ratio of 0.8 or more, an intermediate AlGaN layer (1.7 nm) with an Al molar ratio of 0.7 to 0.8, and an upper n-type AlGaN layer with a thickness of about 66.5 nm. The first conductivity type semiconductor layer 23 is formed of a nitride-based semiconductor having a band gap higher than that of the active layer such that light generated in the active layer passes therethrough. When the gallium nitride-based semiconductor layer is grown on the sapphire substrate 21, the first conductivity type semiconductor layer 23 may generally include a plurality of layers so as to improve a crystal quality.

According to the illustrated exemplary embodiments, as shown in FIG. 3A, the cavities 23h1 and 23h2 may be formed over the holes 21a. As shown in FIG. 3B and FIG. 3C, cavities 23h1 and 23h2 having various shapes may be formed according to growth conditions of the buffer layer 23a, for example, various combinations of two-dimensional growth and three-dimensional growth. The cavities 23h1 and 23h2 are disposed inside the buffer layer 23a, and an upper surface of the buffer layer 23a provides a flat growth surface. A first AlGaN layer 23b may be grown on the flat growth surface of the buffer layer 23a.

In cross-section view, the cavity may be disposed in a region between the flat surface 21b and the flat surface, and may be formed at a location vertically overlapped with a region of the hole 21a. A width of the cavity may not be greater than a width of the hole 21a. Since the cavity does not extend to the flat surface 21b, a bonding strength between the flat surface 21b and the buffer layer 23a is maintained, and thus, it is possible to prevent the substrate 21 from being separated from the semiconductor layer in a process of forming a light emitting device by placing electrodes or others, thereafter.

The cavity includes a lower cavity 23h1 and an upper cavity 23h2, in which both the lower cavity and the upper cavity may be disposed in a region that is vertically overlapped with the region of the hole 21a, or at least one of the two may be disposed. When forming an imaginary line connecting the flat surfaces 21b, the lower cavity 23h1 may be disposed so as to be overlapped with the imaginary line. That is, a portion of the lower cavity 23h1 may be disposed in the hole 21a. Also, when a plurality of lower cavities 23h1 is formed, the plurality of lower cavities 23h1 may be linearly disposed on the imaginary line. An inner region of the lower cavity 23h1 has a different refractive index from those of the semiconductor layers, for example, the buffer layer 23a and the substrate 21, and since the lower cavity 23h1 is disposed on a same line as the flat surface 21b, light proceeding generally parallel to the flat surface 21b may be reflected upwardly by the lower cavity 23h1 to improve the light extraction.

The upper cavity 23h2 may be disposed over the lower cavity 23h1, and the upper cavity may be disposed in the region that is vertically overlapped with the region of the hole 21a. A maximum width of the upper cavity may be greater than a maximum width of the lower cavity, and the maximum width of the upper cavity may be less than a maximum width of the hole. Moreover, a height of the upper cavity may be greater than that of the lower cavity, preferably greater than a depth of the hole. The height of the upper cavity may be greater than the width of the upper cavity.

The cavities 23h1 and 23h2 may be disposed below half of the thickness of the buffer layer 23a. The cavities 23h1 and 23h2 may be disposed closer to the surface of the substrate 21 than the active layer 25, thereby contributing to light scattering, reflection, and emission in a region where the substrate 21 and the semiconductor layer are in contact.

The lower cavity 23h1 may be formed in plurality, and may be disposed to be spaced apart from one another. The plurality of lower cavities 23h1 may have different shapes, and may have irregular shapes. The upper cavity 23h2 may be formed in plurality, and may be disposed to be spaced apart from one another. The plurality of upper cavities 23h2 may have different shapes, and may have irregular shapes. At least one upper cavity 23h2 may have a shape that becomes narrower in a direction closer to the active layer 25.

Referring back to FIG. 1B, a mesa M is disposed on a partial region of the first conductivity type semiconductor layer 23. The mesa M includes the active layer 25 and the second conductivity type semiconductor layer 27. In general, after the first conductivity type semiconductor layer 23, the active layer 25, and the second conductivity type semiconductor layer 27 are sequentially grown, the mesa M is formed by patterning the second conductivity type semiconductor layer 27 and the active layer 25 through a mesa etching process.

The active layer 25 may be a single quantum well structure or a multi-quantum well structure including a well layer and a barrier layer. The well layer may be formed of AlGaN or AlInGaN, and the barrier layer may be formed of AlGaN or AlInGaN having a band gap wider than the well layer. For example, each well layer may be formed of AlGaN having an Al molar ratio of about 0.5 with a thickness of about 3.1 nm, and each barrier layer may be formed of AlGaN having an Al molar ratio of about 0.7 or more with a thickness of about 9 nm or more. In particular, a first barrier layer may be formed to be thicker than other barrier layers with a thickness of 12 nm or more. Meanwhile, AlGaN layers having an Al molar ratio of 0.7 to 0.8 in contact with a top and a bottom of each well layer may be disposed in a thickness of about 1 nm, respectively. However, an Al molar ratio of the AlGaN layer in contact with a last well layer may be 0.8 or more in consideration of the contact with an electron blocking layer.

Meanwhile, the second conductivity type semiconductor layer 27 may include an electron blocking layer and a p-type GaN contact layer. The electron blocking layer prevents electrons from overflowing from the active layer to the second conductivity type semiconductor layer, thereby improving a recombination rate of electrons and holes. The electron blocking layer may be formed of, for example, p-type AlGaN having an Al molar ratio of about 0.8, and may have a thickness of, for example, about 55 nm to about 100 nm. The electron blocking layer may be formed of a plurality of layers having different Al molar ratios. In the plurality of layers having different Al molar ratios, a thickness of a layer having a high Al molar ratio may be twice or more than that of a layer having a low Al molar ratio. A difference in Al molar ratios of the plurality of layers in the electron blocking layer may be in a range of about 0.05 to about 0.1.

When the difference in Al molar ratios is too large, a lattice defect may occur due to a lattice difference, and non-luminescent recombination may occur due to the defect before holes reach the active layer. When the difference in Al molar ratios is too small, a band gap energy is large, and a movement of holes is lowered, and thus, a radiation efficiency may be lowered. Therefore, by setting the difference in Al molar ratios in a range of about 0.05 to about 0.1, an efficiency of the hole movement may be facilitated and the radiation efficiency may be increased. Meanwhile, the p-type contact layer may be formed to have a thickness of about 10 nm to about 50 nm, and may be p-$Al_xGa_{(1-x)}N$ (0≤x<0.8). In addition, the p-type contact layer may be formed of a plurality of layers having different Al molar ratios, in which a layer having a higher Al composition ratio among the plurality of layers may be disposed close to the electron blocking layer.

Meanwhile, the p-type GaN contact layer is used for an ohmic contact. The p-type GaN contact layer may absorb light generated in the active layer 25. The prior art does not solve a drawback of UV absorption by the p-type GaN contact layer. The present disclosure may reduce light absorption of the p-type GaN contact layer by reducing the thickness of the p-type GaN contact layer. In the prior art, the p-type GaN contact layer is generally formed to have a thickness of more than 300 nm, but in the illustrated exemplary embodiment, it may be formed to have a thickness of 50 nm or less, further 30 nm or less. As such, light absorption by the p-type GaN contact layer may be reduced to improve the light extraction efficiency.

In another exemplary embodiment, instead of using the p-type GaN contact layer, an n-type AlGaN layer may be formed as the contact layer using a tunnel junction. For example, the n-type AlGaN layer may be tunnel-junctioned to the p-type AlGaN layer, and the n-type AlGaN layer may be used instead of the p-type contact layer.

The mesa M may have a rectangular shape elongated in one direction, and includes a plurality of via holes 30h exposing the first conductivity type semiconductor layer 23. Each of the via holes 30h may have a concentrically circular shape, and may be arranged at substantially equal intervals to one another in a region of the mesa M. As well illustrated in FIG. 2A, the via-holes 30$h$ may be arranged in a honeycomb shape, and thus, it is possible to make intervals between the via-holes 30$h$ uniform.

The via holes 30$h$ may have a mirror symmetrical structure with respect to a plane passing in a short axis direction of the mesa M. This mirror symmetrical structure assists to spread currents in the mesa M to improve a radiation efficiency.

Meanwhile, the n-ohmic contact layers 31 are disposed on the first conductivity type semiconductor layer 23 exposed to the via holes 30$h$. The n-ohmic contact layers 31 may be formed by depositing a plurality of metal layers, and thereafter, by alloying the metal layers through a rapid thermal alloy (RTA) process. For example, the n-ohmic contact layers 31 may be alloyed through the RTA process after sequentially depositing Cr/Ti/Al/Ti/Au. Accordingly, the n-ohmic contact layers 31 become alloy layers containing Cr, Ti, Al, and Au.

The n-ohmic contact layers 31 are disposed in the via holes 30$h$, respectively. The n-ohmic contact layers 31 are spaced apart from the active layer 25 and the second conductivity type semiconductor layer 27 in the via holes 30$h$. In a UV light emitting diode according to the prior art, an n-ohmic contact layer is generally formed to surround the mesa M along a perimeter of the mesa M, but in the illustrated exemplary embodiment, the n-ohmic contact layer is not disposed around the mesa M. Accordingly, it is possible to prevent light emitted through a side surface of the mesa M from being blocked by the n-ohmic contact layer 31 or the like.

The p-ohmic contact layer 33 is disposed on the second conductivity type semiconductor layer 27 to be in-ohmic contact with the second conductivity type semiconductor layer 27. The p-ohmic contact layer 33 may be formed through, for example, the RTA process after depositing Ni/Rh. The p-ohmic contact layer 33 is in-ohmic contact with the second conductivity type semiconductor layer 27, and covers most of a region over the mesa M, for example, 80% or more. Rh has a higher reflectivity to UV rays than Au, which is advantageous for improving the light extraction efficiency. In the present disclosure, since the thickness of the p-type GaN contact layer is reduced to decrease light absorption by the p-type GaN contact layer, so as to reflect light passing through the second conductivity type semiconductor layer 27, favorable reflection performance of the p-ohmic contact layer 33 is required.

The lower insulation layer 35 covers the mesa M, and covers the p-ohmic contact layer 33 and the n-ohmic contact layers 31. The lower insulation layer 35 also covers the exposed first conductivity type semiconductor layer 23 around the mesa M and in the via holes 30$h$. Meanwhile, the lower insulation layer 35 has openings 35$a$ for allowing electrical connection to the n-ohmic contact layers 31 and openings 35$b$ for allowing electrical connection to the p-ohmic contact layer 33. The opening 35$b$ may be formed so as to surround all of the via holes 30$h$ in a ring shape.

The lower insulation layer 35 may be formed of, for example, SiO$_2$, without being limited thereto, or may be formed as a distributed Bragg reflector.

Meanwhile, the n-pad metal layer 37$a$ and the p-pad metal layer 37$b$ are disposed on the lower insulation layer 35. In one form, the n-pad metal layer 37$a$ and the p-pad metal layer 37$b$ may be formed together in the same process as the same metal layer and disposed on the same level, that is, on the lower insulation layer 35. The n- and p-pad metal layers 37$a$ and 37$b$ may include, for example, Al layers.

The n-pad metal layer 37$a$ is electrically connected to the n-ohmic contact layers 31 through the openings 35$a$ of the lower insulation layer 35. The n-ohmic contact layers 31 are electrically connected to one another by the n-pad metal layer 37$a$. The n-pad metal layer 37$a$ may be disposed within the region of the mesa M. The n-pad metal layer 37$a$ may function as a reflection layer (second reflection layer) that reflects light emitted through the side surface of the mesa M in the via hole 30$h$, thereby improving a light efficiency of the light emitting diode.

Meanwhile, the p-pad metal layer 37$b$ may be electrically connected to the p-ohmic contact layer 33 through the opening 35$b$ of the lower insulation layer 35. The p-pad metal layer 37$b$ may cover the opening 35$b$, and may surround the n-pad metal layer 37$a$ in a ring shape. The p-pad metal layer 37$b$ may be limited in the region over the mesa M such that the p-pad metal layer does not cover side surfaces of the mesa M.

The upper insulation layer 39 covers the n-pad metal layer 37$a$ and the p-pad metal layer 37$b$. Meanwhile, the upper insulation layer 39 has openings 39$a$ exposing the n-pad metal layer 37$a$ and has openings 39$b$ over the mesa M exposing the p-pad metal layer 37$b$. The opening 39$a$ may expose the n-pad metal layer 37$a$ near one edge of the mesa M, and the opening 39$b$ may expose the p-pad metal layer 37$b$ near an opposite edge of the mesa M.

A plurality of openings 39$a$ may be arranged, without being limited thereto, or one opening 39$a$ may be arranged. In addition, although the opening 39$b$ is illustrated as being continuously formed in a C shape in the drawing, the plurality of openings 39$b$ may be disposed apart from one another. The upper insulation layer 39 may be formed of, for example, silicon nitride or silicon oxide.

The n-bump 41$a$ and the p-bump 41$b$ are placed on the upper insulation layer 39. The n-bump 41$a$ covers the openings 39$a$ and is connected to the n-pad metal layer 37$a$ exposed through the openings 39$a$. The n-bump 41$a$ is electrically connected to the first conductivity type semiconductor layer 23 through the n-pad metal layer 37$a$ and the n-ohmic contact layer 31. Outer edges of the n-bump 41$a$ and the p-bump 41$b$ may be disposed over the mesa M so as not to cover the side surface of the mesa M.

The p-bump 41$b$ covers the opening 39$b$ and is connected to the p-pad metal layer 37$b$ exposed through the opening 39$b$. The p-bump 41$b$ is electrically connected to the second conductivity type semiconductor layer 27 through the p-pad metal layer 37$b$ and the p-ohmic contact layer 33.

The n-bump 41$a$ and the p-bump 41$b$ may be formed of, for example, Ti/Au/Cr/Au. As shown in FIG. 1, the n-bump 41$a$ and the p-bump 41$b$ may be disposed opposite each other, and may occupy about ⅓ of an area of the mesa M, respectively. By making the areas of the n-bump 41$a$ and the p-bump 41$b$ relatively wide, heat generated in the light emitting diode may be easily dissipated, thereby improving a performance of the light emitting diode.

Furthermore, the openings 39$a$ and 39$b$ are covered by the n-bump 41$a$ and the p-bump 41$b$, and thus, moisture or solder from the outside may be prevented from infiltrating into a device through the openings 39$a$ and 39$b$, thereby improving a reliability thereof.

Meanwhile, although not shown, an anti-reflection layer may be disposed on a light exiting surface of the substrate 21. The anti-reflection layer may be formed of a transparent insulation layer such as SiO$_2$ to have a thickness that is an integer multiple of ¼ of a wavelength of ultraviolet rays, for example. Alternatively, a bandpass filter in which layers having different refractive indices are repeatedly stacked may be used as the anti-reflection layer.

FIGS. 4A, 5A, 6A, 7A, 8A, 9A, 10A, and 11A are schematic plan views illustrating a method of manufacturing a UV light emitting diode according to an exemplary embodiment of the present disclosure, and FIGS. 4B, 5B, 6B, 7B, 8B, 9B, 10B, and 11B are schematic cross-sectional views taken along line A-A' of its corresponding plan view shown in FIGS. 4A, 5A, 6A, 7A, 8A, 9A, 10A, and 11A, respectively.

Figure 4A:
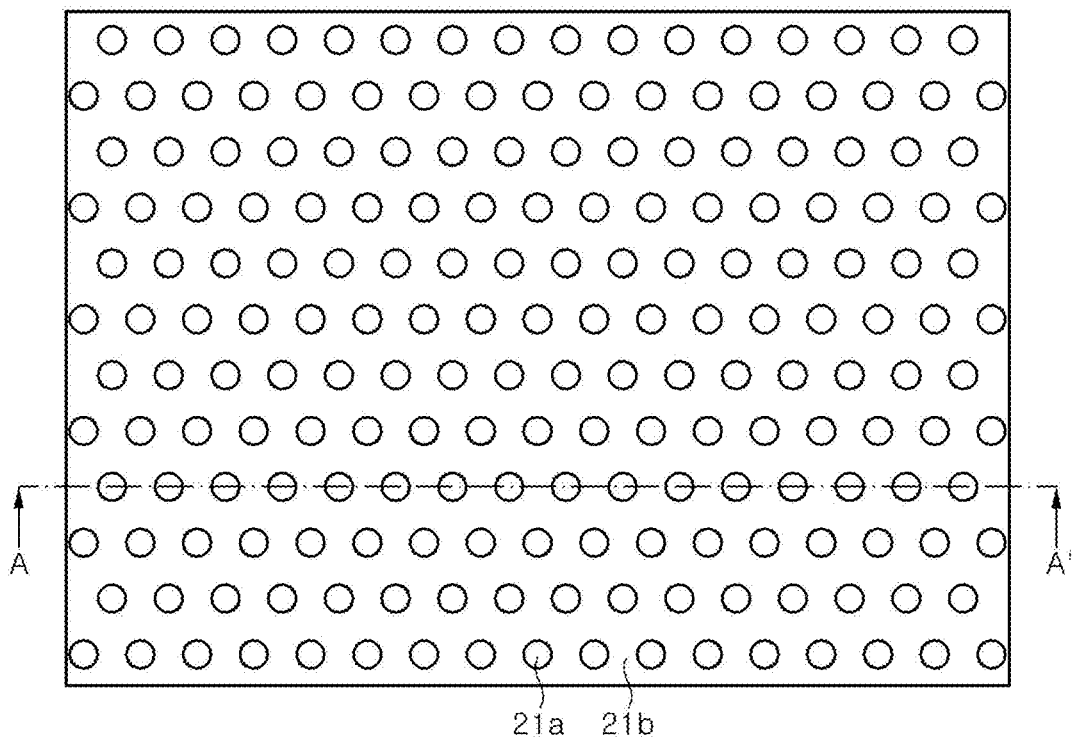
FIGS. 4A, 5A, 6A, 7A, 8A, 9A, 10A, and 11A are schematic plan views illustrating a method of manufacturing a UV light emitting diode according to an exemplary embodiment of the present disclosure.
Figure 4B:
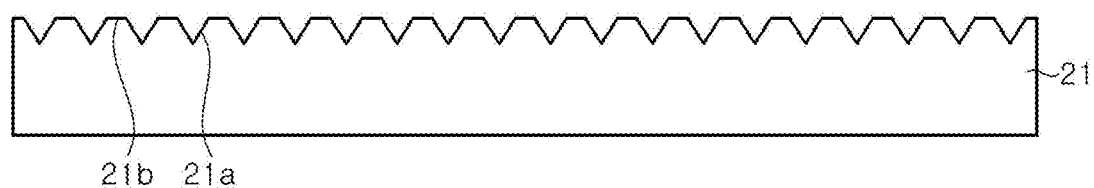
FIGS. 4B, 5B, 6B, 7B, 8B, 9B, 10B, and 11B are schematic cross-sectional views taken along line A-A' of its corresponding plan view shown in FIGS. 4A, 5A, 6A, 7A, 8A, 9A, 10A, and 11A, respectively.

First, referring to FIG. 4A and FIG. 4B, a hole pattern is formed on an upper surface of a substrate 21. A plurality of holes 21a may be formed on the surface of the substrate. The holes 21a may be formed using photolithography and etching processes, but expensive equipment has to be introduced for the photolithography process so as to form small-sized holes 21a. In order to avoid this, nano-imprint technology may be used. Sizes, shapes, and arrangements of the holes 21a are identical to those described above with reference to FIGS. 2A, 2B, and 2C, and thus detailed descriptions thereof will be omitted.

Figure 5A:
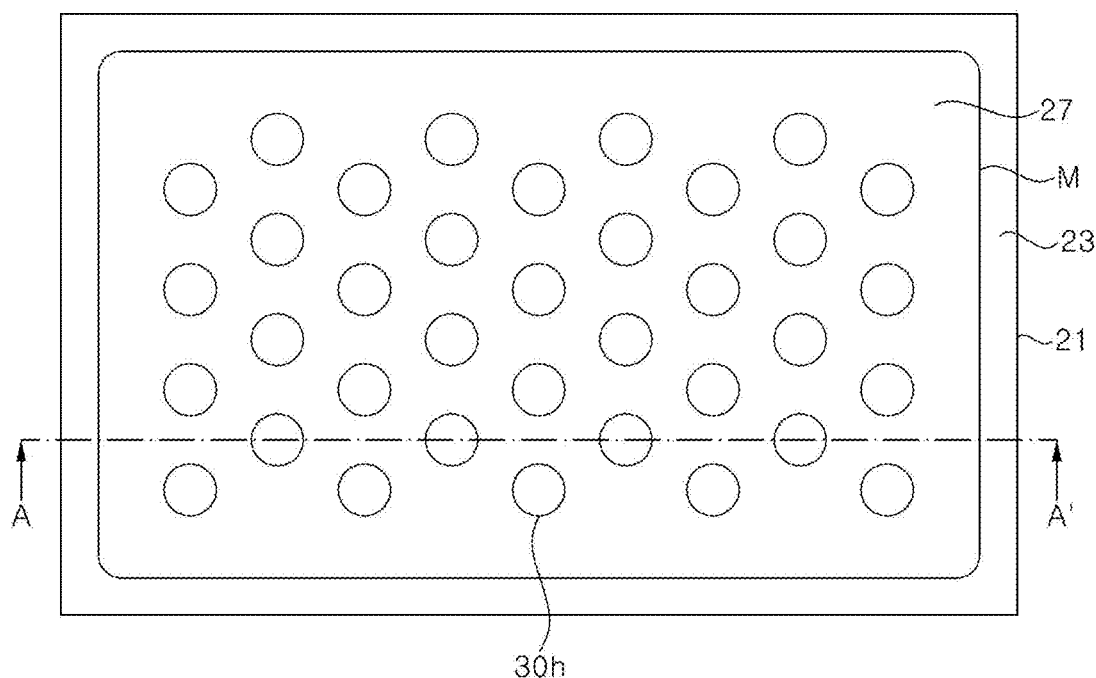
Figure 5B:
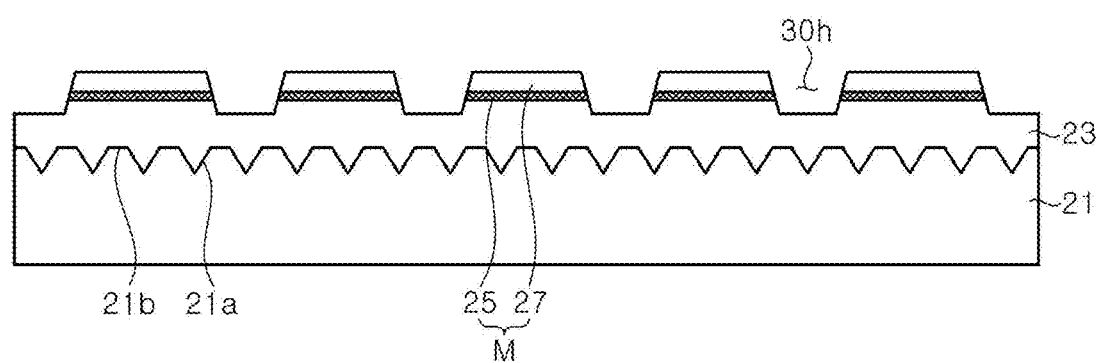

Referring to FIG. 5A and FIG. 5B, a first conductivity type semiconductor layer 23, an active layer 25, and a second conductivity type semiconductor layer 27 are grown on the substrate 21.

Since the first conductivity type semiconductor layer 23, the active layer 25, and the second conductivity type semiconductor layer 27 are identical to those described above, detailed descriptions thereof will be omitted to avoid redundancy. However, the second conductivity type semiconductor layer 27 may include a semiconductor layer having a band gap smaller than a well layer of the active layer 25, for example, a GaN layer. In particular, a p-type GaN layer may be used for an ohmic contact. The semiconductor layer having the band gap smaller than the well layer is controlled to have a thickness of 500 nm or less, furthermore, 30 nm or less. In another exemplary embodiment, the p-type GaN layer is omitted, and an n-type AlGaN layer tunnel-junctioned to the p-type AlGaN layer may be used instead of the p-type contact layer.

Meanwhile, a mesa M is formed by patterning the second conductivity type semiconductor layer 27 and the active layer 25. The mesa M may have a generally elongated rectangular shape, but the inventive concepts are not limited to a specific shape. As the mesa M is formed, the first conductivity type semiconductor layer 23 may be exposed along a perimeter of the mesa M. Also, a plurality of via holes 30h are formed in a mesa M region. The via holes 30h expose the first conductivity type semiconductor layer 23. The via holes 30h may be spaced apart from one another at substantially equal intervals, and may be arranged, for example, in a honeycomb structure. Furthermore, the via-holes 30h may be spaced apart from an edge of the mesa M by more than the interval between the via-holes 30h.

Figure 6A:
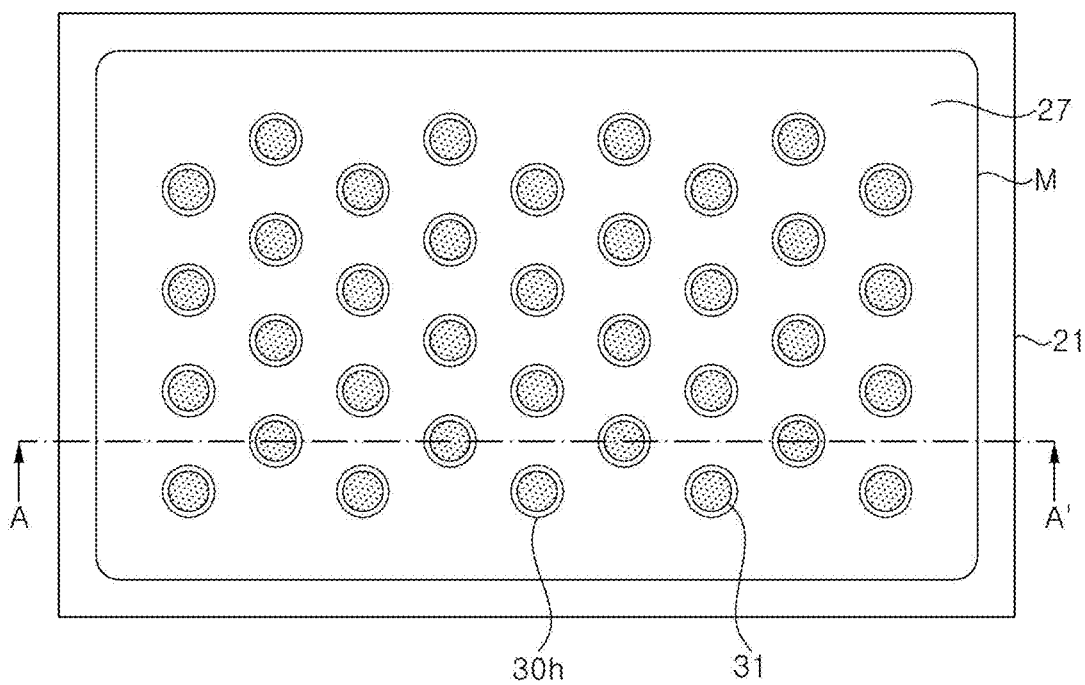
Figure 6B:
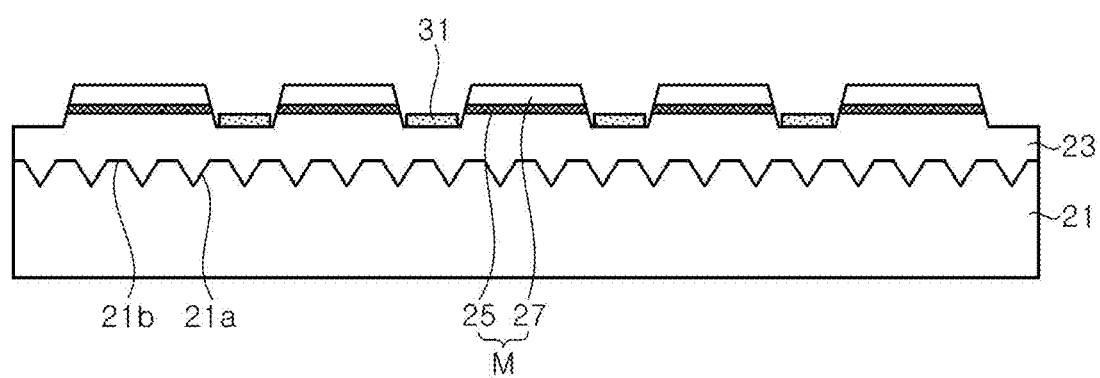

Referring to FIG. 6A and FIG. 6B, n-ohmic contact layers 31 are formed on bottom surfaces of the via holes 30h. The n-ohmic contact layers 31 may be alloyed through an RTA process, for example, after sequentially depositing Cr/Ti/Al/Ti/Au. For example, the n-ohmic contact layer 31 may be alloyed through the RTA process at about 965° C. for 30 seconds.

Figure 7A:
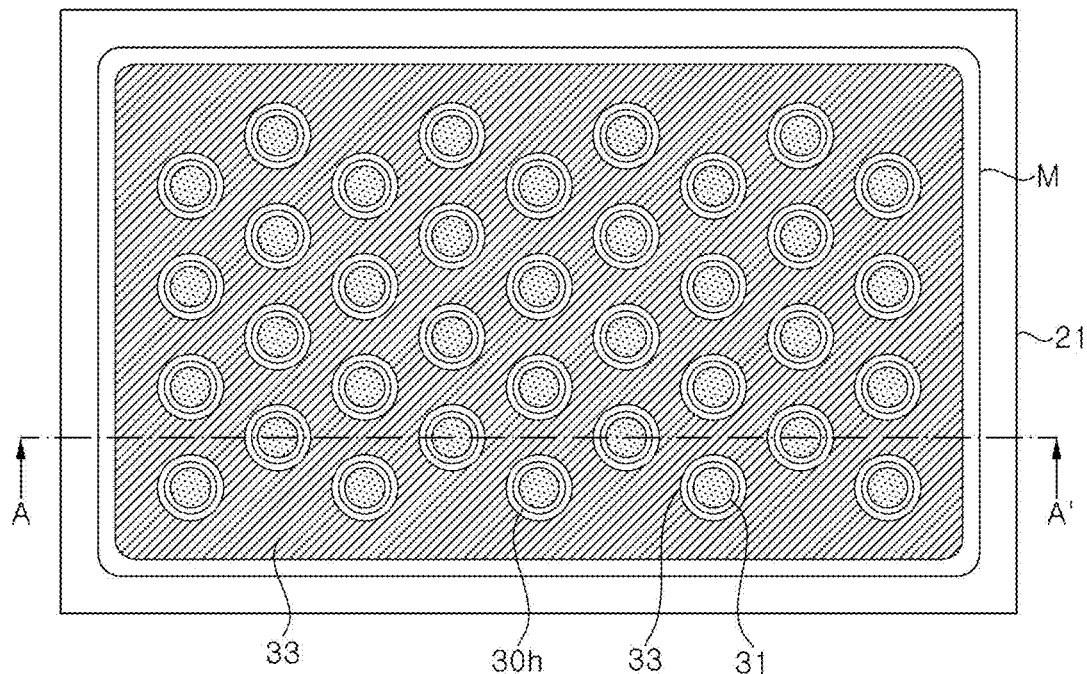
Figure 7B:
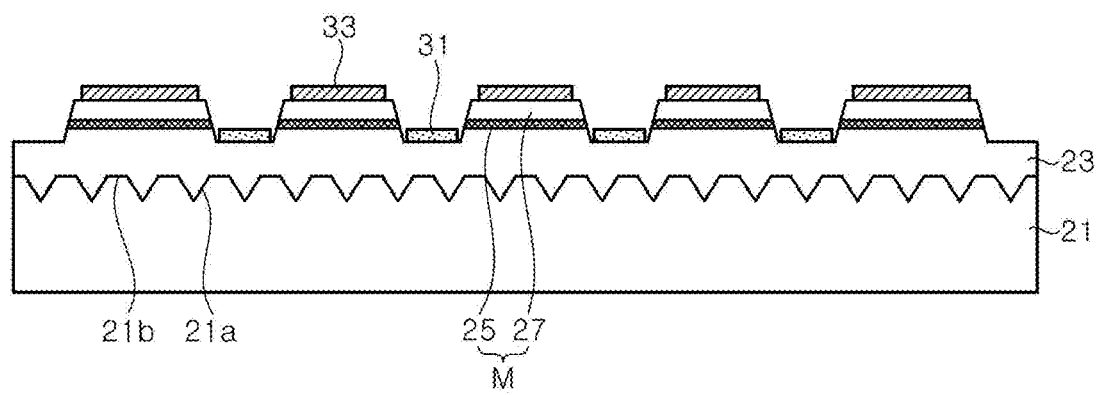

Referring to FIG. 7A and FIG. 7B, after the n-ohmic contact layer 31 is formed, a p-ohmic contact layer 33 is formed on the mesa M. The p-ohmic contact layer 33 is in ohmic contact with the second conductivity type semiconductor layer 27. In particular, the p-ohmic contact layer 33 may be in ohmic contact with the p-type GaN layer.

The p-ohmic contact layer 33 may include a reflection metal layer such as Au or Rh. For example, after depositing Ni/Au or Ni/Rh, it may be alloyed through the RTA process. Ni/Au may be heat-treated, for example, at 590° C. for 80 seconds. In contrast, Ni/Rh may be heat-treated at a relatively lower temperature for a longer time, for example, may be heat-treated at 500° C. for 5 minutes. Rh has a higher reflectivity to UV rays than Au, and thus, the light extraction efficiency may be further increased.

Figure 8A:
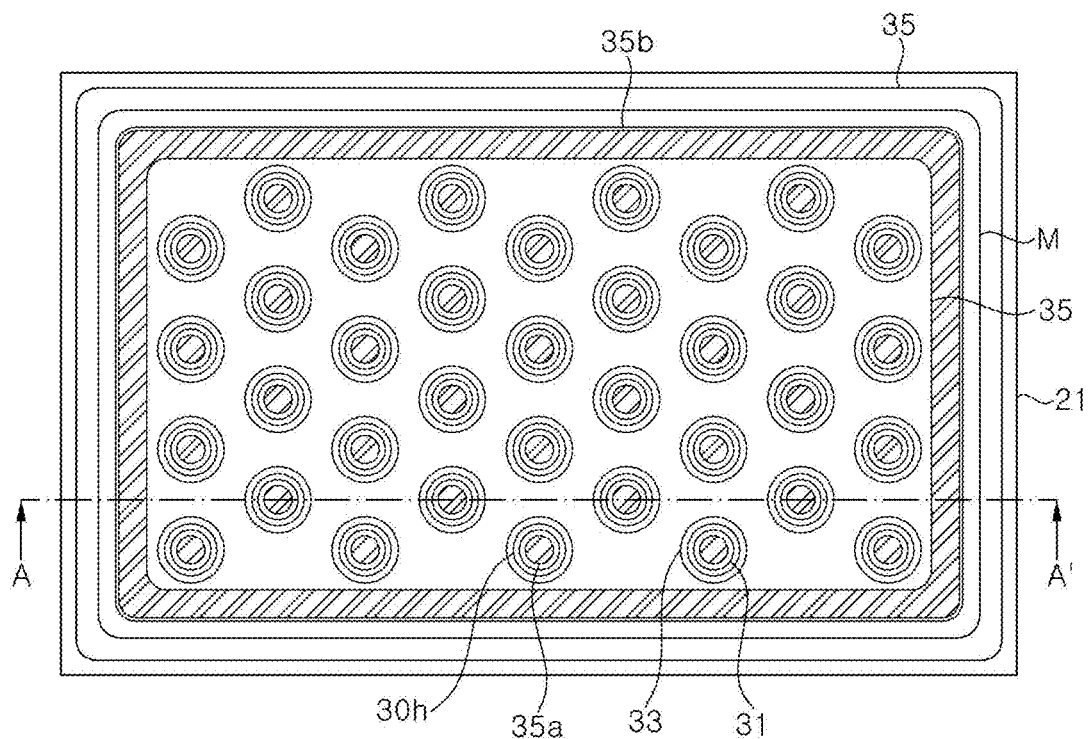
Figure 8B:
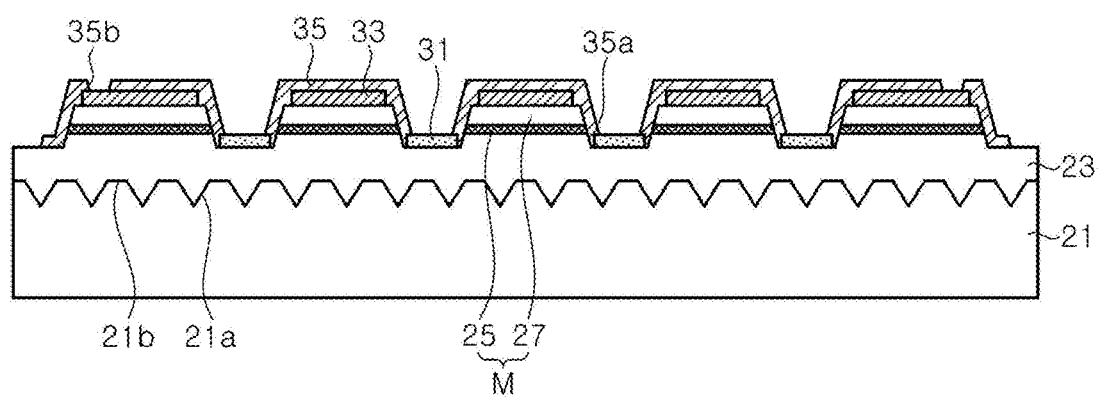

Furthermore, Ni/Rh is advantageous compared to Ni/Au because an interface between the p-type contact layer 27 and the p-ohmic contact layer 33 is formed smoothly to exhibit stable ohmic resistance characteristics. In addition, since the present invention reduces light absorption of the p-type contact layer 27 by reducing a thickness of the p-type GaN contact layer, an amount of light reflected by the p-ohmic contact layer 33 is increased. Accordingly, the light extraction efficiency may be improved by using Rh having a relatively high reflectivity. Referring to FIG. 8A and FIG. 8B, a lower insulation layer 35 is formed on the mesa M. The lower insulation layer 35 covers side and upper surfaces of the mesa M. The lower insulation layer 35 covers the n-ohmic contact layer 31 and the p-ohmic contact layer 33. Meanwhile, the lower insulation layer 35 has openings 35a exposing the n-ohmic contact layers 31 and openings 35b exposing the p-ohmic contact layer 33.

The opening 35b of the lower insulation layer 35 may be formed in a ring shape along an entire perimeter of the via holes 30h. However, the inventive concepts are not limited thereto, and a plurality of openings may be formed so as to expose the p-ohmic contact layer 33. For example, a portion of the ring-shaped opening 35b close to the via holes 30h may be covered with the lower insulation layer 35, and openings may be formed in portions thereof relatively far from the via holes 30h.

Figure 9A:
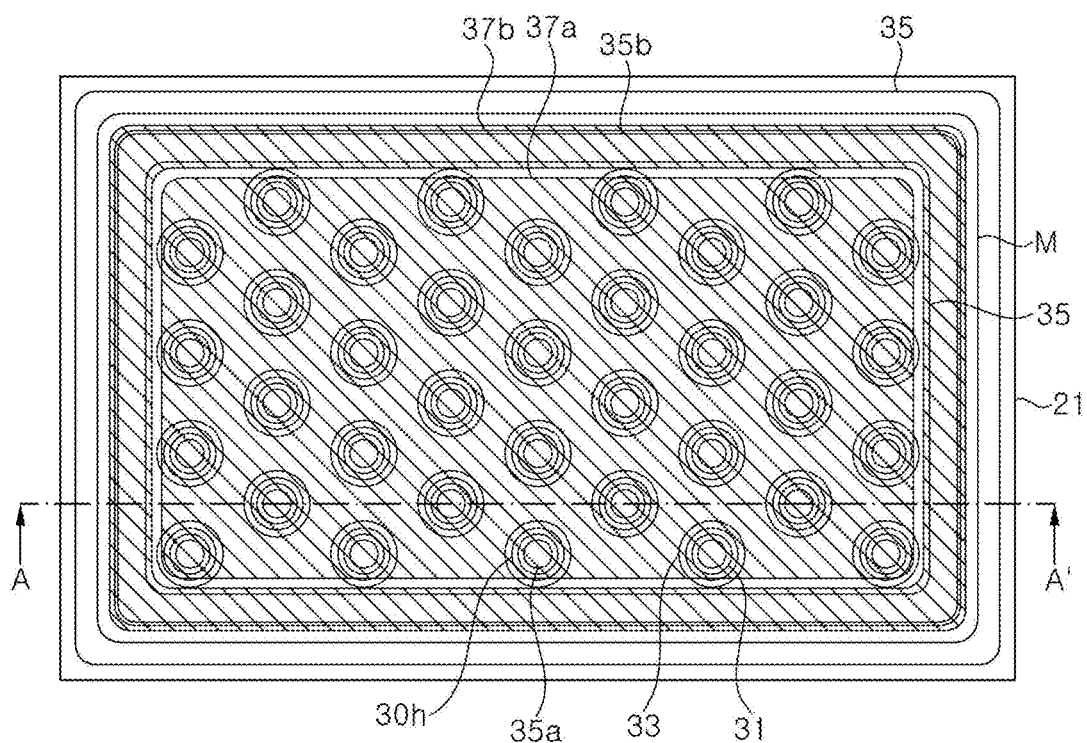
Figure 9B:
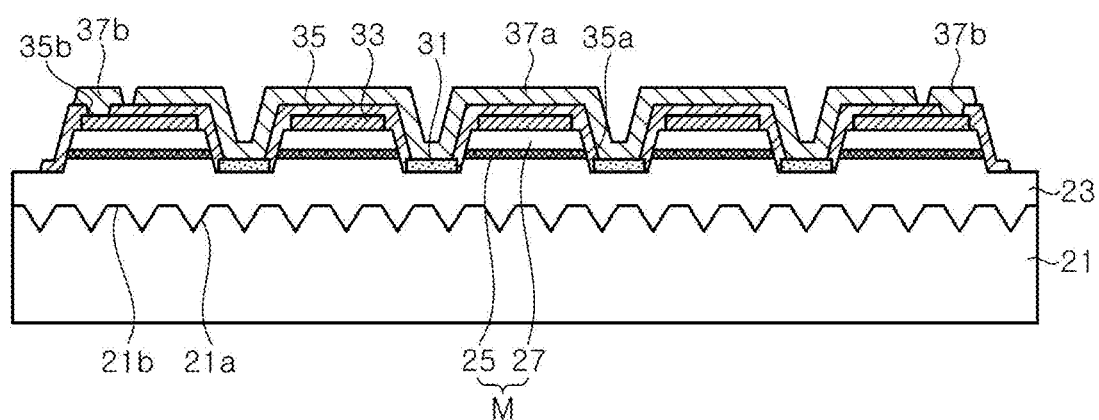

Referring to FIG. 9A and FIG. 9B, an n-pad metal layer 37a and a p-pad metal layer 37b are formed on the lower insulation layer 35. The n-pad metal layer 37a may be formed so as to cover the via-holes 30h, and may be electrically connected to the n-ohmic contact layers 31 in the via-holes 30h. The n-pad metal layer 37a may also cover inner walls of the via holes 30h.

The p pad metal layer 37b may cover the opening 35b, and may be electrically connected to the p-ohmic contact layer 33 exposed to the opening 35b. The p-pad metal layer 37b may be formed in a ring shape so as to surround the n-pad metal layer 37a. The p-pad metal layer 37b may be formed so as to cover the side surface of the mesa M, or may be formed to be limited in a region over the mesa M so as not to block light emitted to the side surface of the mesa M.

Figure 10A:
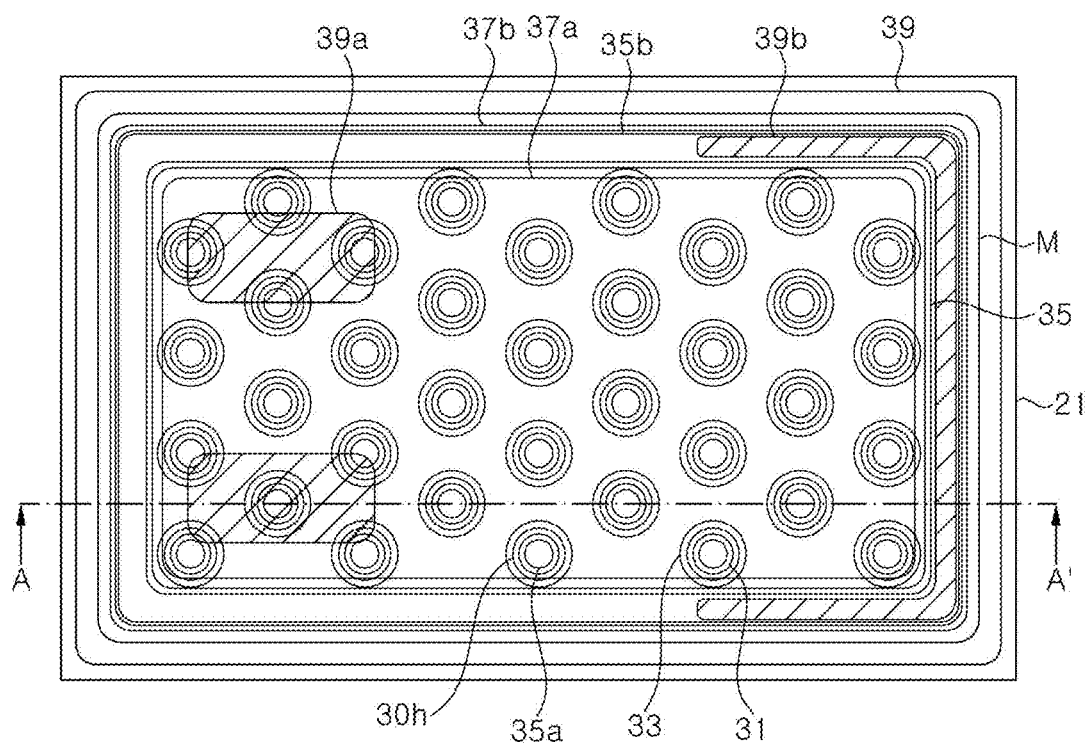
Figure 10B:
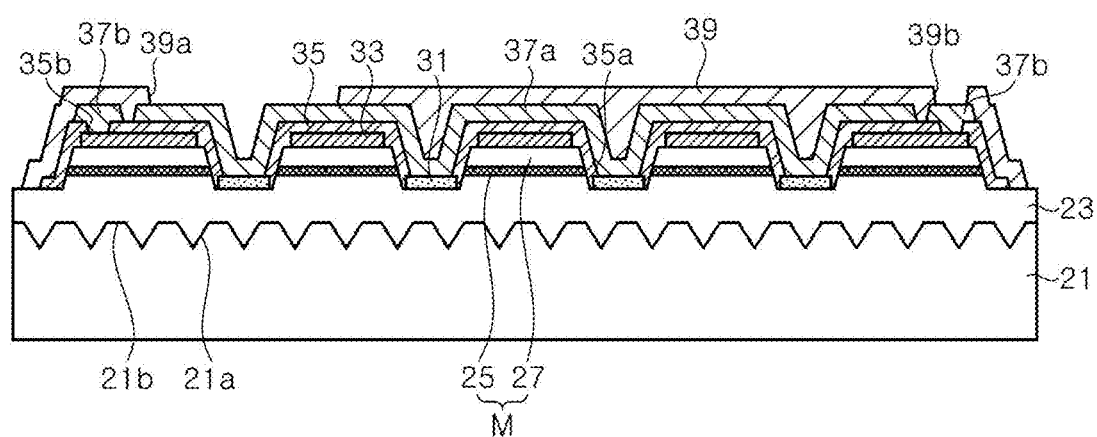

Referring to FIG. 10A and FIG. 10B, an upper insulation layer 39 is formed on the n-pad metal layer 37a and the p-pad metal layer 37b. The upper insulation layer 39 may cover the n-pad metal layer 37a and the p-pad metal layer 37b and may also cover the side surface of the mesa M.

Meanwhile, the upper insulation layer 39 has openings 39a and 39b exposing the n-pad metal layer 37a and the p-pad metal layer 37b. The openings 39a expose the n-pad metal layer 37a, and the openings 39b expose the p-pad metal layer 37b. The openings 39a may be formed near one edge of the mesa M, and the opening 39b may be formed near an opposite edge of the mesa M to face the openings 39a.

Figure 11A:
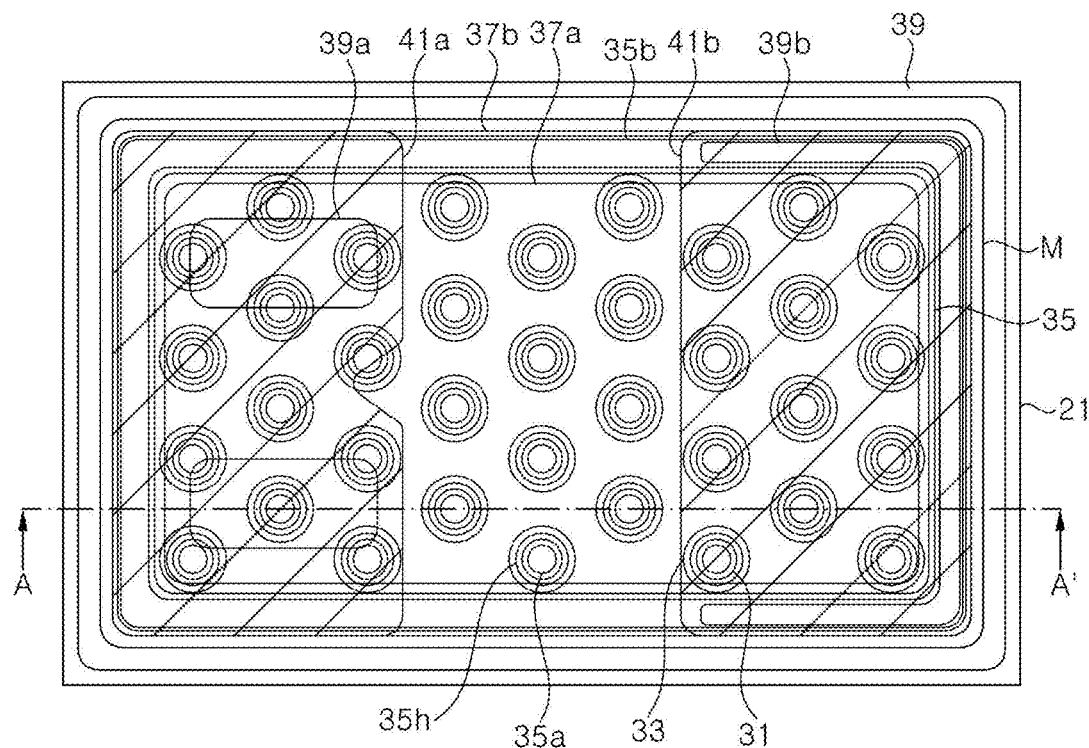
Figure 11B:
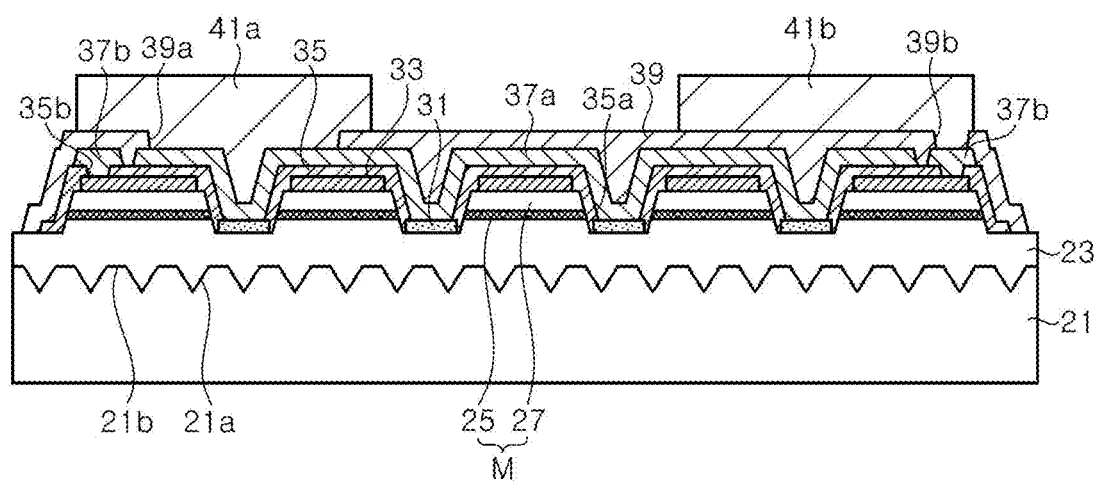

Referring to FIG. 11A and FIG. 11B, an n-bump 41a and a p-bump 41b are formed on the upper insulation layer 39. The n-bump 41a is electrically connected to the n-pad metal layer 37a through the openings 39a, and the p-bump 41b is electrically connected to the p-pad metal layer 37b through the opening 39b.

The n-bump 41a and p-bump 41b may partially cover the side surface of the mesa M, respectively, but may be formed so as to be limited a region over the mesa M.

According to the illustrated exemplary embodiment, current may be uniformly spread over an entire region of the mesa M by forming the via holes 30h in the mesa M region and forming the n-ohmic contact layers 31. In addition, the light extraction efficiency may be improved by reducing the thickness of the p-type GaN contact layer that absorbs light generated in the active layer 25 and by using Ni/Rh as the p-ohmic contact layer 33.

Although the via hole 30h has been illustrated and described as having a circular shape in the previous exemplary embodiment, the shape of the via hole is not limited to the circular shape, and may have various other shapes. The shape and the size of the via hole 30h affect the size of the ohmic contact region or the size of the light emitting region. Accordingly, the shape of the via hole 30h may vary so as to adjust a magnitude of a radiation intensity.

Figure 12A:
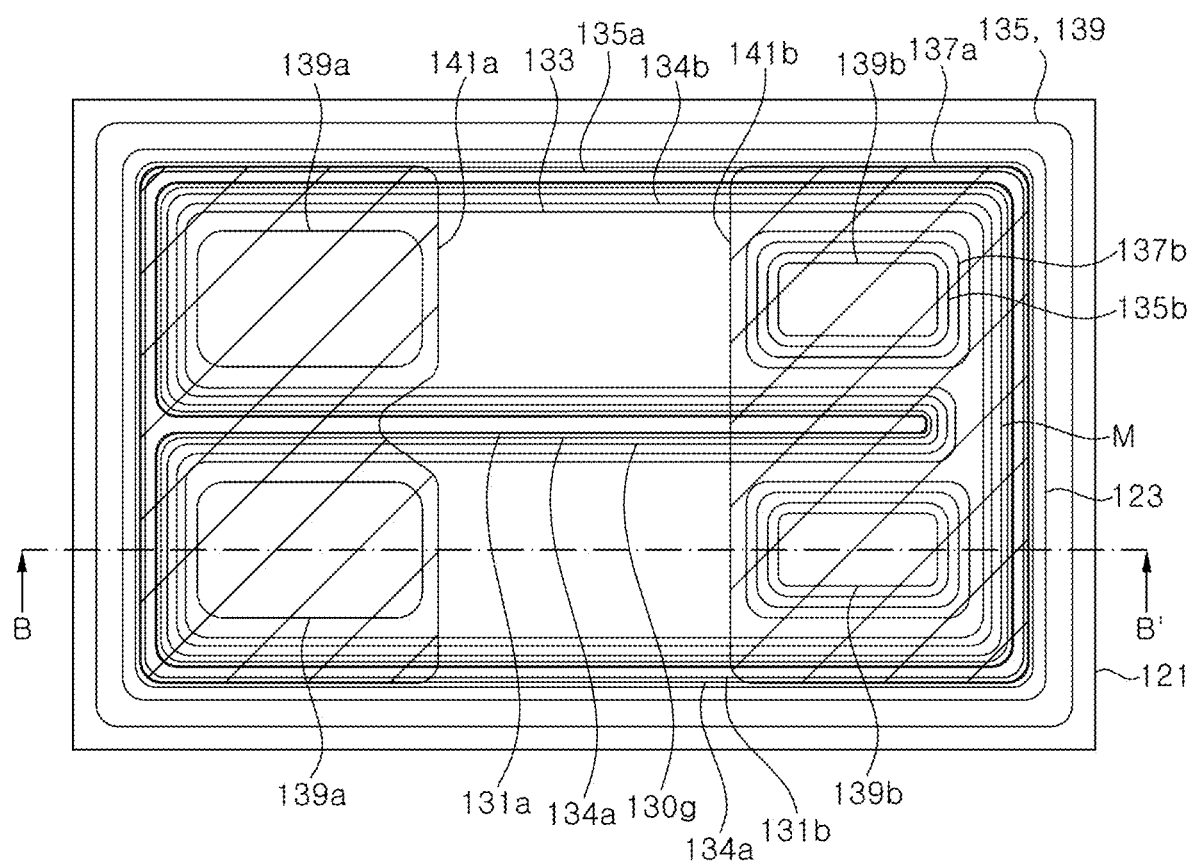
FIG. 12A is a schematic plan view illustrating a UV light emitting diode according to an exemplary embodiment of the present disclosure.
Figure 12B:
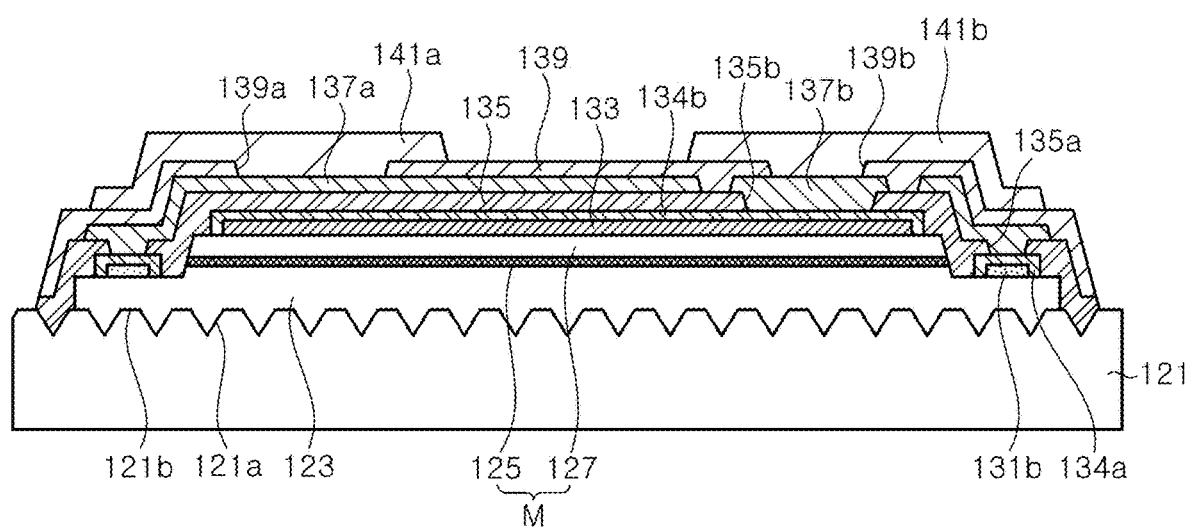
FIG. 12B is a schematic cross-sectional view taken along line B-B' of its corresponding plan view shown in FIG. 12A.

FIG. 12A is a schematic plan view illustrating a UV light emitting diode according to an exemplary embodiment of the present disclosure, and FIG. 12B is a schematic cross-sectional view taken along line B-B' of its corresponding plan view shown in FIG. 12A.

Referring to FIG. 12A and FIG. 12B, the UV light emitting diode according to the illustrated exemplary embodiment may include a substrate 121, a first conductivity type semiconductor layer 123, an active layer 125, a second conductivity type semiconductor layer 127, and n-ohmic contact layers 131a and 131b, a p-ohmic contact layer 133, an n-capping layer 134a, a p-capping layer 134b, a lower insulation layer 135, an n-pad metal layer 137a, a p-pad metal layer 137b, an upper insulation layer 139, an n-bump 141a, and a p-bump 141b.

The substrate 121 includes a plurality of holes 121a surrounded by a flat surface 121b. Since the substrate 121 is similar to the substrate 21 described with reference to FIGS. 1A and 1B, a detailed description thereof will be omitted to avoid redundancy. The first conductivity type semiconductor layer 123 is disposed on the substrate 121. The first conductivity type semiconductor layer 123 is substantially similar to the first conductivity type semiconductor layer 23 described with reference to FIGS. 1A and 1B. In addition, as described with reference to FIG. 3A, a cavity may be formed in the first conductivity type semiconductor layer 123. However, in the illustrated exemplary embodiment, edges of an n-type semiconductor layer 123 may be disposed inside a region surrounded by edges of the substrate 121, and thus, an upper surface of the substrate 121 may be exposed along the edges of the first semiconductor layer 123. However, the inventive concepts are not limited thereto, and an entire surface of the substrate 121 may be covered with the first conductivity type semiconductor layer 123. Furthermore, an upper surface of an AlN layer, which is a portion of the first conductivity type semiconductor layer 123, may be exposed near the edge of the substrate 121.

A mesa M is disposed on a partial region of the first conductivity type semiconductor layer 123. The mesa M includes the active layer 125 and the second conductivity type semiconductor layer 127. In general, the first conductivity type semiconductor layer 123, the active layer 125, and the second conductivity type semiconductor layer 127 are sequentially grown, and thereafter, the mesa M is formed by patterning the second conductivity type semiconductor layer 127 and the active layer 125 through a mesa etching process.

Since a stacked structure of the active layer 125 and the second conductivity type semiconductor layer 127 is similar to that described with reference to FIGS. 1A and 1B, a detailed description thereof will be omitted to avoid redundancy.

The mesa M may have a rectangular external shape elongated in one direction, and includes a groove 130g exposing the first conductivity type semiconductor layer 123. The groove 130g may extend along a longitudinal direction of the mesa M. As shown in FIG. 12A, the groove 130g may extend from one edge of the mesa M toward an opposite edge thereof along the longitudinal direction of the mesa M. A mesa region is disposed on both sides of the groove 130g by the groove 130g. A length of the groove 130g exceeds ½ of a length of the mesa M. In other words, the length of the groove 130g is greater than a distance between an inner end of the groove 130g and the opposite edge of the mesa M. Furthermore, the distance between the inner end of the groove 130g and the opposite edge of the mesa M may be smaller than a width of the mesa region disposed on both sides of the groove 130g.

The groove 130g may have a linear shape, and the mesa M may have a symmetrical structure with respect to a straight line passing through a center of the light emitting diode and parallel to the groove 130g.

Meanwhile, corners of the mesa M may have curved shapes. The edge of the mesa M may include a straight region and curved regions disposed on both sides thereof. By forming the corners of the mesa M to be curved, it is possible to prevent light from being condensed at the corner portion and thereby being lost due to light absorption.

Meanwhile, the n-ohmic contact layer 131a is disposed on the first conductivity type semiconductor layer 123 exposed by the groove 130g. The n-ohmic contact layer 131b is disposed on the first conductivity type semiconductor layer 123 exposed along a perimeter of the mesa M. The n-ohmic contact layer 131a may be connected to the n-ohmic contact layer 131b, but the inventive concepts are not limited thereto. The n-ohmic contact layers 131a and 131b may be spaced apart from the mesa M to surround the mesa M.

Materials and methods of forming the n-ohmic contact layers 131a and 131b are similar to those of forming the n-ohmic contact layers 31 described with reference to FIGS. 1A and 1B, and thus, detailed descriptions thereof will be omitted to avoid redundancy.

The p-ohmic contact layer 133 is disposed on the second conductivity type semiconductor layer 127 to be in ohmic contact with the second conductivity type semiconductor layer 127. The p-ohmic contact layer 133 may be formed using, for example, Ni/Rh or Ni/Au. The p-ohmic contact layer 133 is in ohmic contact with the second conductivity type semiconductor layer 127 and covers most of a region over the mesa M, for example, 80% or more.

The n-capping layer 134a may cover upper surfaces and side surfaces of the n-ohmic contact layers 131a and 131b. The p-capping layer 134b may cover the upper and side surfaces of the p-ohmic contact layer 133. The n-capping layer 134a and the p-capping layer 134b prevent the n-ohmic contact layers 131a and 131b and the p-ohmic contact layer 133 from being damaged by etching, oxidation, or the like, respectively. The n-capping layer 134a and the p-capping layer 134b may be formed of a same metal in a same process. For example, the n-capping layer 134a and the p-capping layer 134b may be formed of Ti/Au/Ti.

The lower insulation layer 135 covers the mesa M, and covers the n-capping layer 134a and the p-capping layer 134b. The lower insulation layer 135 also covers the first conductivity type semiconductor layer 123 exposed around the mesa M and in the groove 130g. Furthermore, the lower insulation layer 135 may cover a portion of the substrate 121 exposed around the first conductivity type semiconductor layer 123. Meanwhile, the lower insulation layer 135 has openings 135a for allowing electrical connection to the n-ohmic contact layers 131a and 131b and openings 135b for allowing electrical connection to the p-ohmic contact layer 133. The opening 135a may have a shape similar to those of the n-ohmic contact layers 131a and 131b or the n-capping layer 134a. That is, the opening 135a surrounds the mesa M and also extends into the groove 130g. A width of the opening 135a may be smaller than that of the n-capping layer 134a, and thus, the first conductivity type semiconductor layer 123 may not be exposed through the opening 135a. Meanwhile, the opening 135b is disposed in the region over the mesa M, and exposes the p-capping layer 134b. A plurality of openings 135b may be disposed on the p-capping layer 134b. In particular, the openings may be symmetrically disposed on both sides of the groove 130g.

The lower insulation layer 135 may be formed of, for example, $SiO_2$, without being limited thereto, and may be formed as a distributed Bragg reflector. In particular, the lower insulation layer 135 may be formed so as to constitute an omni-directional reflector (ODR). For example, the lower insulation layer 135 may be formed of about 10,000 Å of $SiO_2$.

Meanwhile, the n-pad metal layer 137a and the p-pad metal layer 137b are disposed on the lower insulation layer 135. In one form, the n-pad metal layer 137a and the p-pad metal layer 137b may be formed together in the same process with the same metal layer and disposed on a same level, that is, on the lower insulation layer 135. The n-pad and p-pad metal layers 137a and 137b may include, for example, an Al layer.

The n-pad metal layer 137a is electrically connected to the n-ohmic contact layers 131a and 131b through the opening 135a of the lower insulation layer 135. The n-pad metal layer 137a may directly contact the n-capping layer 134a through the opening 135a of the lower insulation layer 135. The n-pad metal layer 137a may cover most region of the mesa M, and may also cover a region around the mesa M. The n-pad metal layer 137a may form the ODR together with the lower insulation layer 135.

Meanwhile, the p-pad metal layer 137b may be electrically connected to the p-ohmic contact layer 133 through the opening 135b of the lower insulation layer 135. The p-pad metal layers 137b may cover each of the openings 135b. Each of the p-pad metal layers 137b may be surrounded by the n-pad metal layer 137a. The p-pad metal layers 37b may be limited in the region over the mesa M. In the illustrated exemplary embodiment, all side surfaces of the mesa M are covered with the n-pad metal layer 137a. Accordingly, it is possible to prevent light loss from occurring at the side surfaces of the mesa M.

The upper insulation layer 139 covers the n-pad metal layer 137a and the p-pad metal layer 137b. However, the upper insulation layer 139 may have openings 139a exposing the n-pad metal layer 137a and openings 139b exposing the p-pad metal layer 137b. The opening 139a may expose the n-pad metal layer 137a near one edge of the mesa M, and the openings 139b may expose the p-pad metal layer 137b near the opposite edge of the mesa M. The openings 139a and 139b may be symmetrically disposed with respect to a line passing through the groove 130g, but the inventive concepts are not limited thereto.

The upper insulation layer 139 may be formed of, for example, silicon nitride or silicon oxide.

The n-bump 141a and the p-bump 141b are disposed on the upper insulation layer 139. The n-bump 141a covers the openings 139a and is connected to the n-pad metal layer 137a exposed through the openings 139a. The n-bump 141a is electrically connected to the first conductivity type semiconductor layer 123 through the n-pad metal layer 137a and the n-ohmic contact layers 131a and 131b. The n-bump 141a and the p-bump 141b may partially cover the side surfaces of the mesa M.

The p-bump 141b covers the openings 139b and is connected to the p-pad metal layer 137b exposed through the openings 139b. The p-bump 141b is electrically connected to the second conductivity type semiconductor layer 127 through the p-pad metal layer 137b and the p-ohmic contact layer 133.

The n-bump 141a and p-bump 141b may include Ti/Au, and may be formed of, for example, Ti/Au/Cr/Au or Ti/Ni/Ti/Ni/TiNi/Ti/Au. As shown in FIG. 12A, the n-bump 141a and the p-bump 141b may be disposed opposite each other, and may occupy about ⅓ of an area of the mesa M, respectively. By making the areas of the n-bump 141a and the p-bump 141b relatively wide, heat generated in the light emitting diode may be easily dissipated, thereby improving a performance of the light emitting diode.

Furthermore, the openings 139a and 139b are covered by the n-bump 141a and the p-bump 141b, and thus, moisture or solder from the outside may be prevented from infiltrating into the openings 139a and 139b, thereby improving reliability.

Meanwhile, although not shown, an anti-reflection layer may be disposed on a light exiting surface of the substrate 121. The anti-reflection layer may be formed of a transparent insulation layer such as $SiO_2$ to have a thickness that is an integer multiple of ¼ of a wavelength of ultraviolet rays, for example. Alternatively, a bandpass filter in which layers having different refractive indices are repeatedly stacked may be used as the anti-reflection layer.

FIGS. 13A, 14A, 15A, 16A, 17A, 18A, 19A, and 20A are schematic plan views illustrating a method of manufacturing a UV light emitting diode according to an exemplary embodiment of the present disclosure, and FIGS. 13B, 14B, 15B, 16B, 17B, 18B, 19B, and 20B are schematic cross-sectional views taken along line A-A' of its corresponding plan view shown in FIGS. 13A, 14A, 15A, 16A, 17A, 18A, 19A, and 20A, respectively.

Figure 13A:
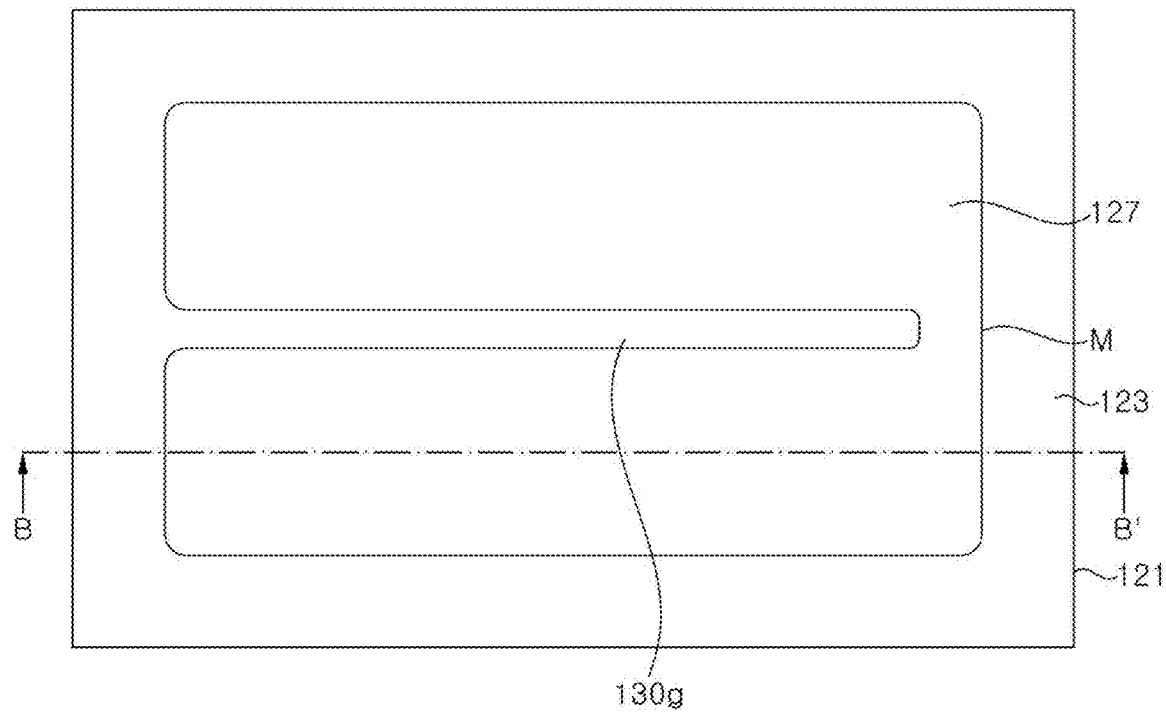
FIGS. 13A, 14A, 15A, 16A, 17A, 18A, 19A, and 20A are schematic plan views illustrating a method of manufacturing a UV light emitting diode according to an exemplary embodiment of the present disclosure.
Figure 13B:
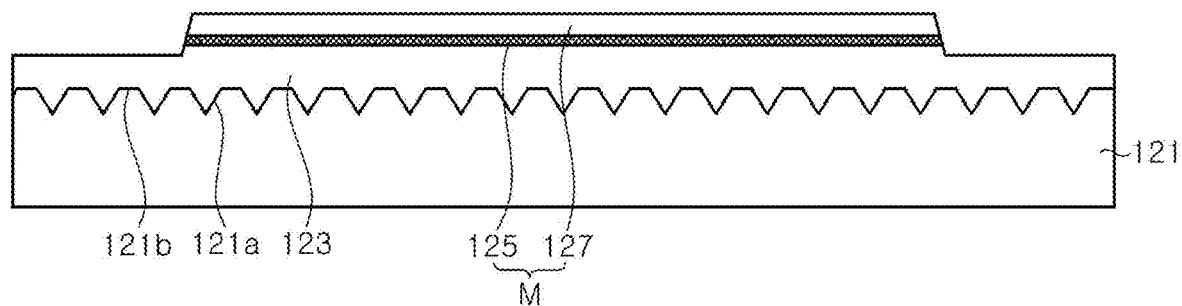
FIGS. 13B, 14B, 15B, 16B, 17B, 18B, 19B, and 20B are schematic cross-sectional views taken along line A-A' of its corresponding plan view shown in FIGS. 13A, 14A, 15A, 16A, 17A, 18A, 19A, and 20A, respectively.

Referring to FIG. 13A and FIG. 13B, first, a first conductivity type semiconductor layer 123, an active layer 125, and a second conductivity type semiconductor layer 127 are grown on a substrate 121.

The substrate 121 includes a plurality of holes 121a surrounded by a flat surface 121b. Since the substrate 121, the first conductivity type semiconductor layer 123, the active layer 125, and the second conductivity type semiconductor layer 127 are identical to those described above, detailed descriptions thereof will be omitted to avoid redundancy.

Meanwhile, a mesa M is formed by patterning the second conductivity type semiconductor layer 127 and the active layer 125. The mesa M may have a generally elongated rectangular shape, but the inventive concepts are not limited to a specific shape. As the mesa M is formed, the first conductivity type semiconductor layer 123 may be exposed along a perimeter of the mesa M. In addition, a groove 130g is formed in a mesa M region. The groove 130g may extend from one edge toward an opposite edge along a longitudinal direction of the mesa M. An inner end of the groove 130g may be disposed near the opposite edge. The mesa regions disposed on both sides of the groove 130g may be identical to one another, and a width of each of the mesa regions may be greater than or equal to a distance between the inner end of the groove 130g and the opposite edge of the mesa M.

Figure 14A:
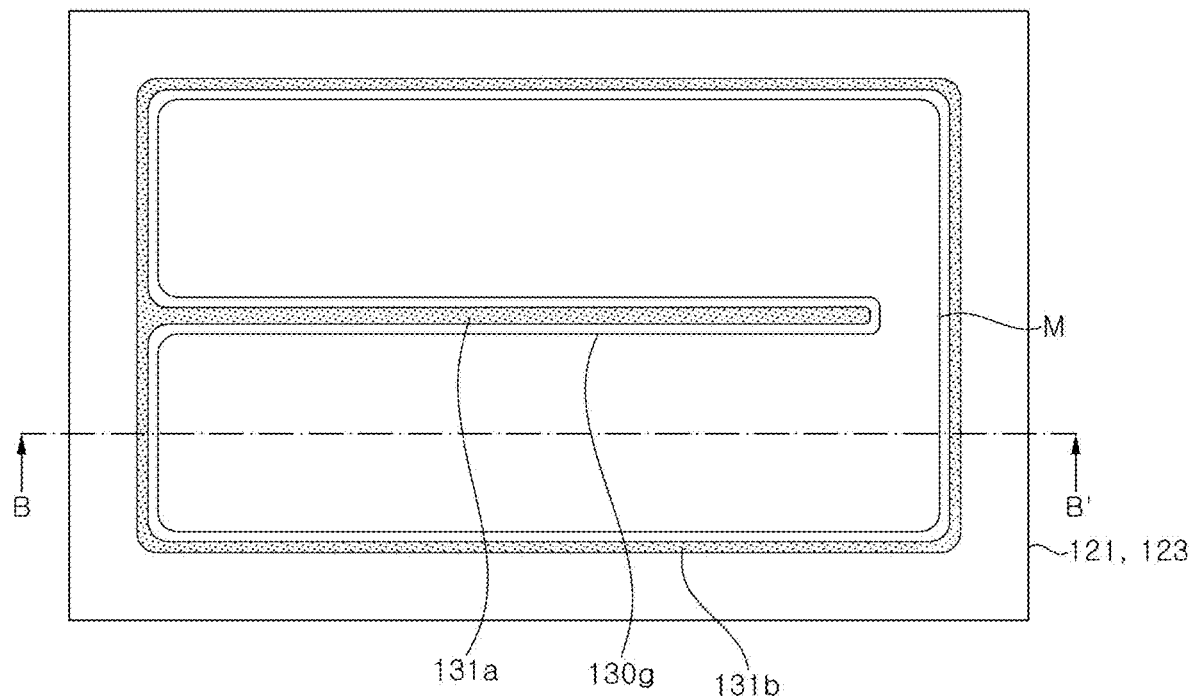
Figure 14B:
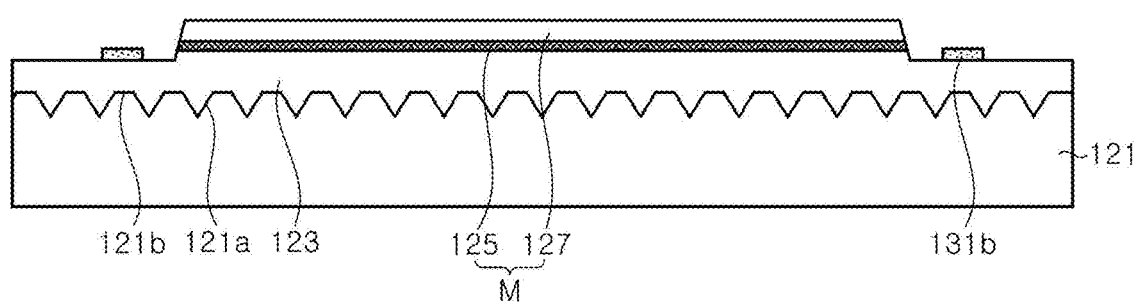

Referring to FIG. 14A and FIG. 14B, n-ohmic contact layers 131a and 131b are formed on the first conductivity type semiconductor layer 123. The n-ohmic contact layers 131a and 131b may be formed by, for example, sequentially depositing Cr/Ti/Al/Ti/Au, and thereafter being alloyed using an RTA process. For example, the n-ohmic contact layers 131a and 131b may be alloyed through the RTA process at about 965° C. for 30 seconds. The n-ohmic contact layer 131a is formed on the first conductivity type semiconductor layer 123 exposed by the groove 130g, and the n-ohmic contact layer 131b is formed on the first conductivity type semiconductor layer 123 exposed around the mesa M. The n-ohmic contact layer 131a may extend from the n-ohmic contact layer 131b. By continuously forming the n-ohmic contact layer 131a and the n-ohmic contact layer 131b, current spreading may be aided. However, the inventive concepts are not limited thereto, and the n-ohmic contact layer 131a may be spaced apart from the n-ohmic contact layer 131b.

Figure 15A:
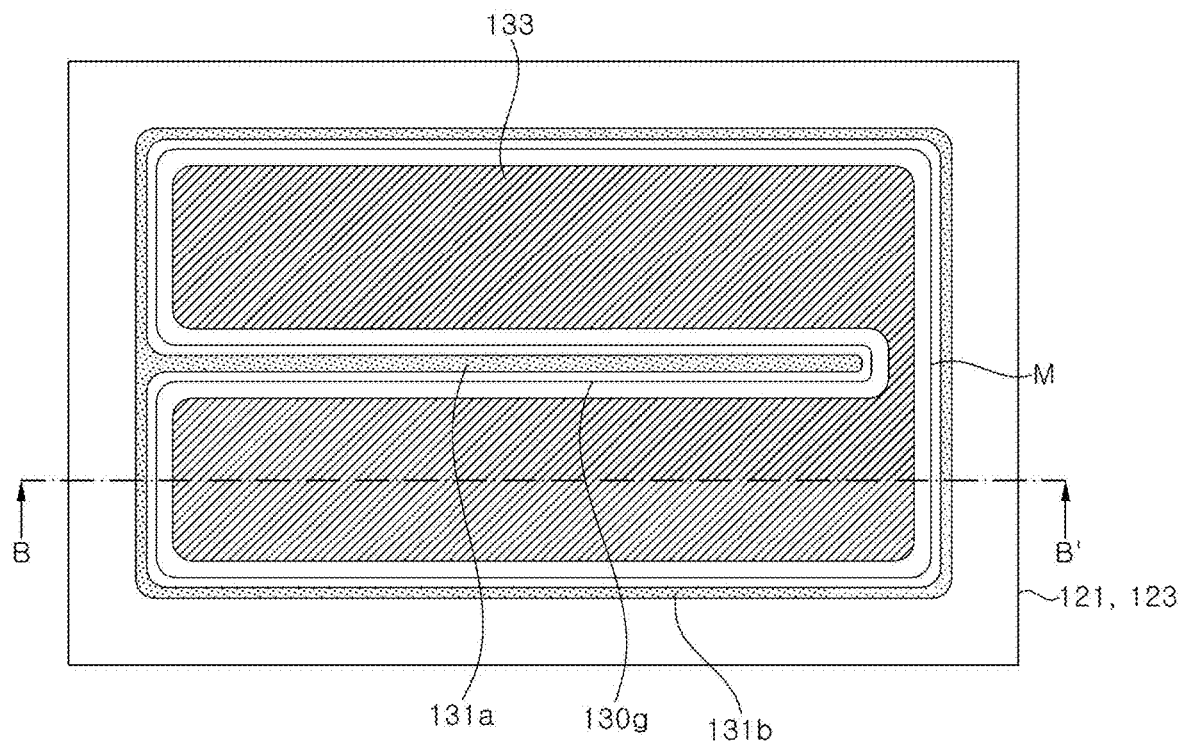
Figure 15B:
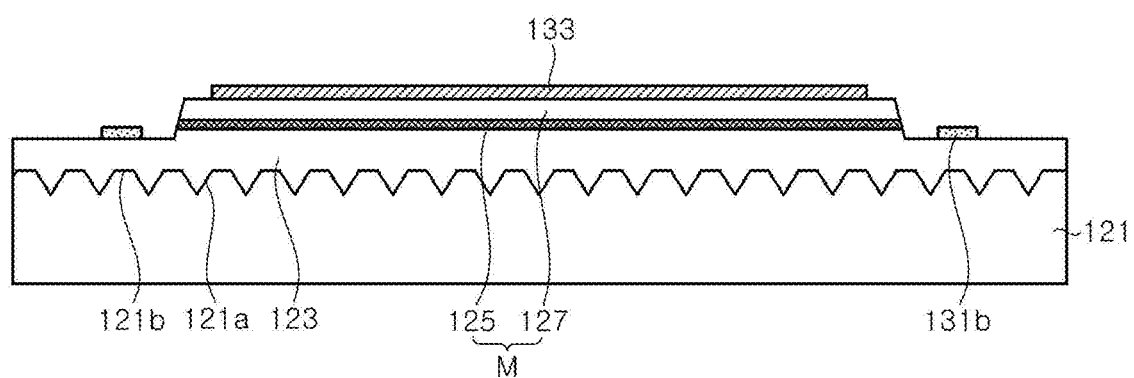

Referring to FIG. 15A and FIG. 15B, after the n-ohmic contact layers 131a and 131b are formed, a p-ohmic contact layer 133 is formed on the mesa M. The p-ohmic contact layer 133 is in ohmic contact with the second conductivity type semiconductor layer 127. In particular, the p-ohmic contact layer 133 may be in ohmic contact with a p-type GaN layer.

The p-ohmic contact layer 133 may include a reflection metal layer such as Au or Rh. For example, after depositing Ni/Au or Ni/Rh, it may be alloyed through the RTA process.

Figure 16A:
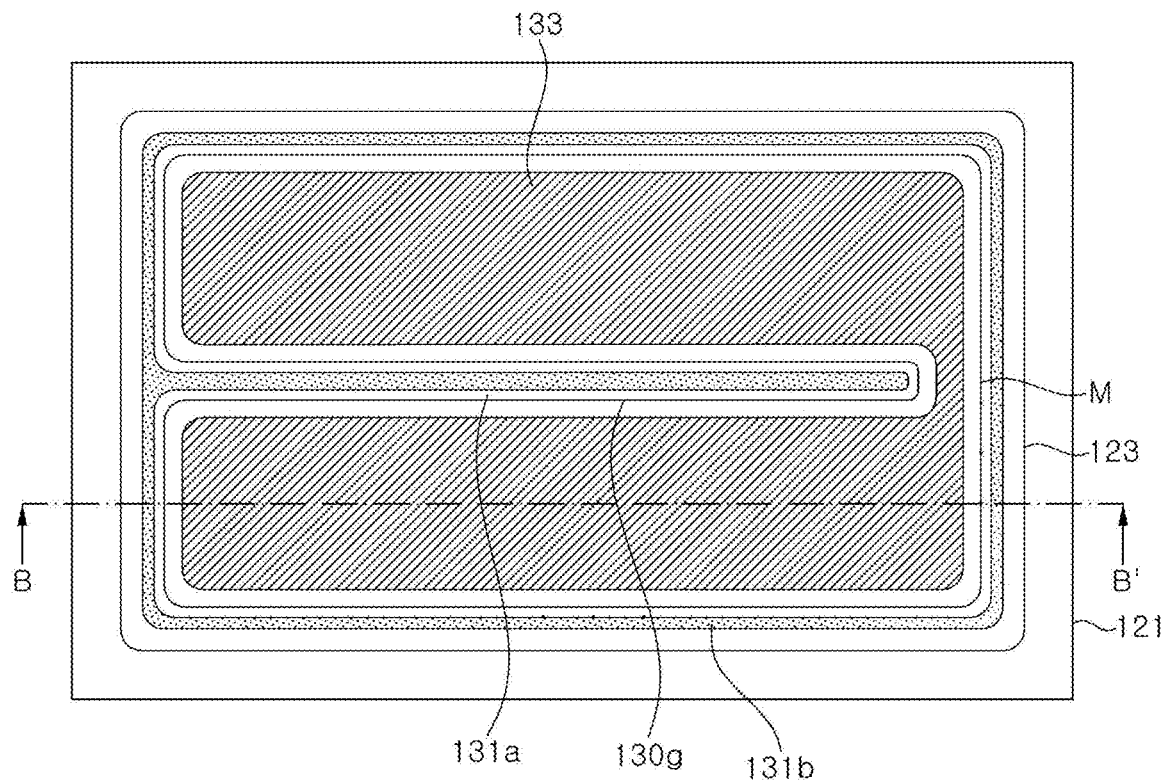
Figure 16B:
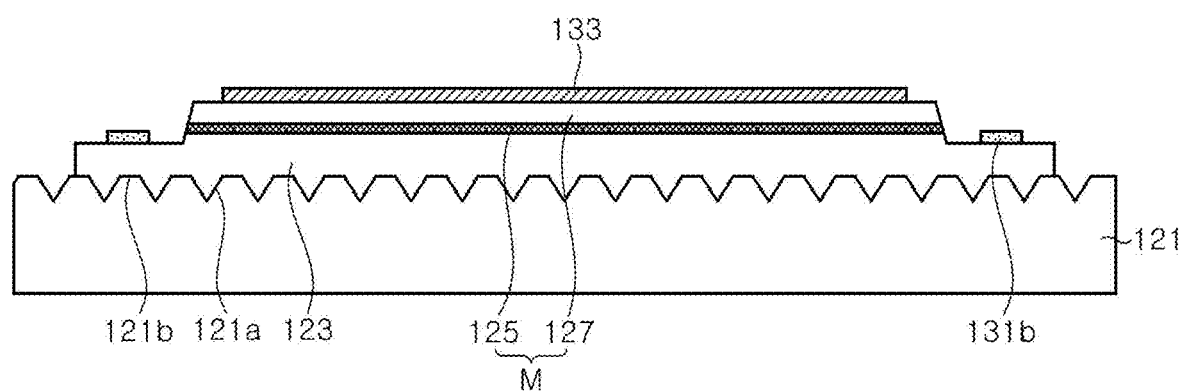

Referring to FIG. 16A and FIG. 16B, an isolation process for dividing the first conductivity type semiconductor layer 123 is carried out. That is, the first conductivity type semiconductor layer 123 between adjacent light emitting diode regions is removed to expose an upper surface of the substrate 121. By adding the isolation process, singularization of the light emitting diodes may be aided.

Figure 17A:
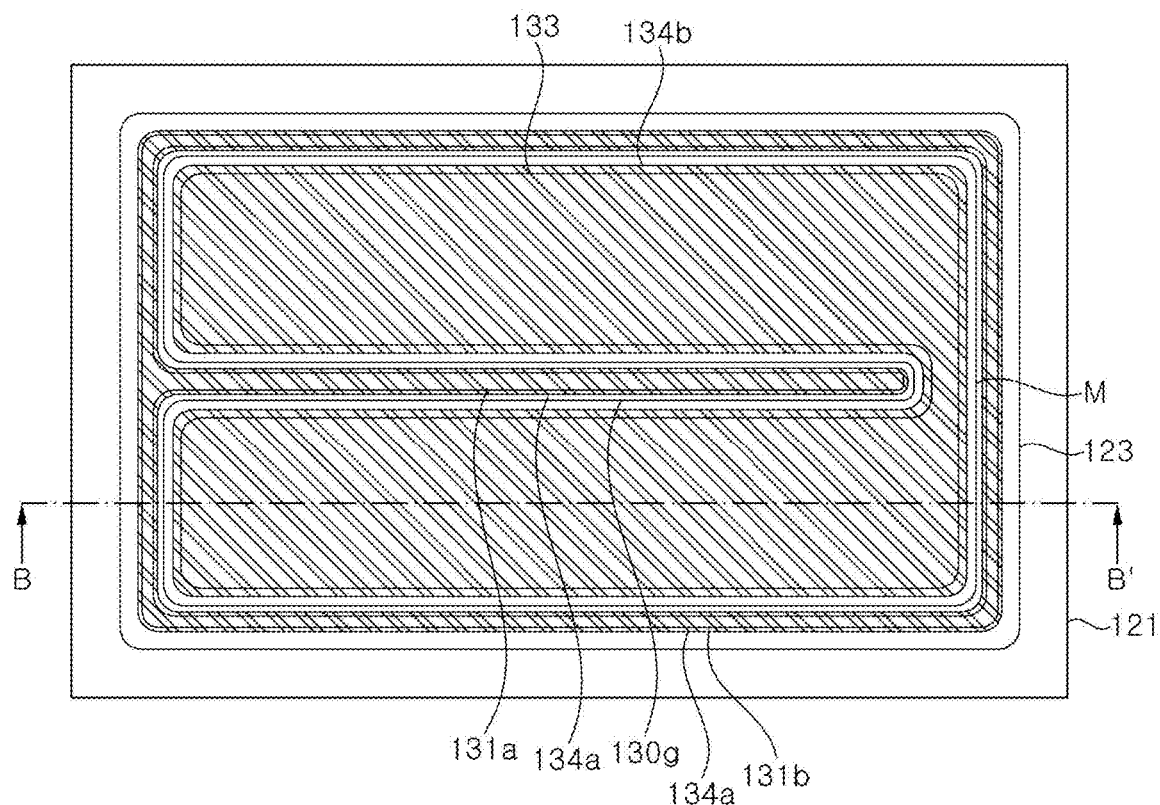
Figure 17B:
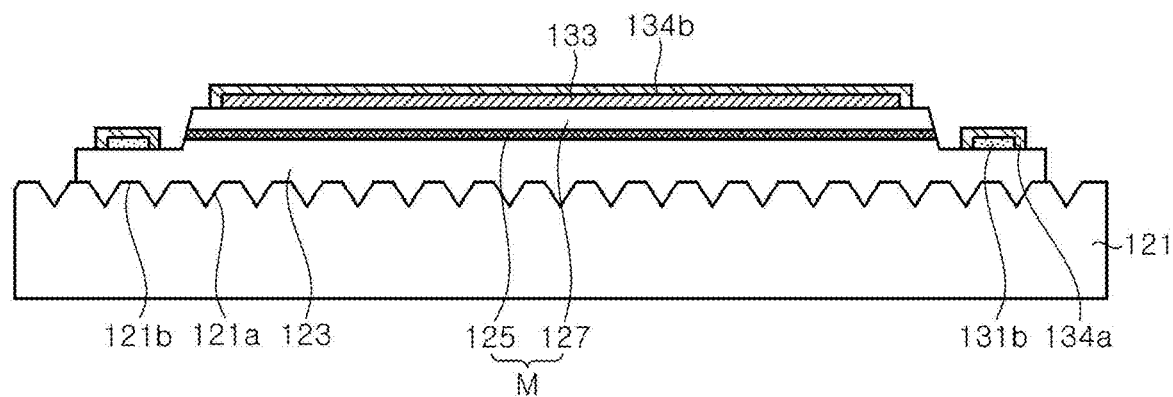

Referring to FIG. 17A and FIG. 17B, an n-capping layer 134a and a p-capping layer 134b are formed. The n-capping layer 134a covers upper and side surfaces of the n-type ohmic contact layers 131a and 131b, and the p-capping layer 134b covers upper and side surfaces of the p-type ohmic contact layer 133. The n-capping layer 134a and the p-capping layer 134b may be formed of, for example, Ti/Au/Ti.

Figure 18A:
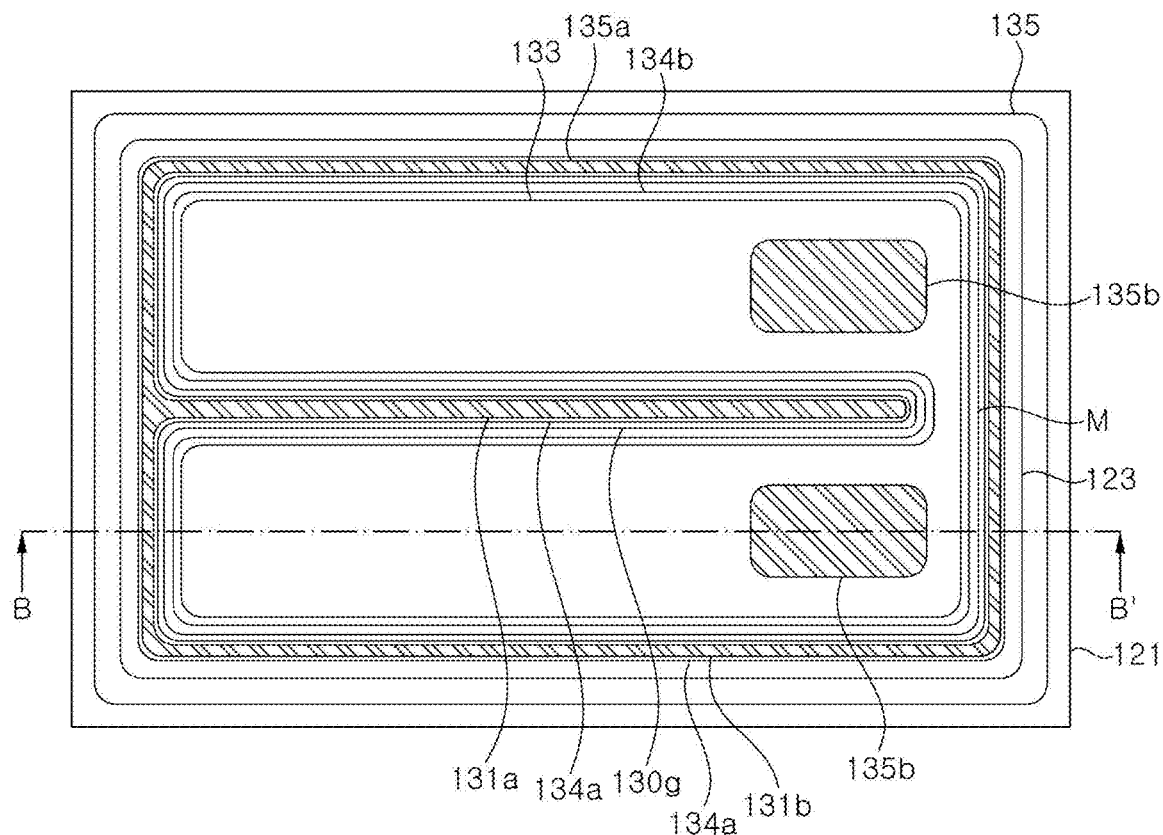
Figure 18B:
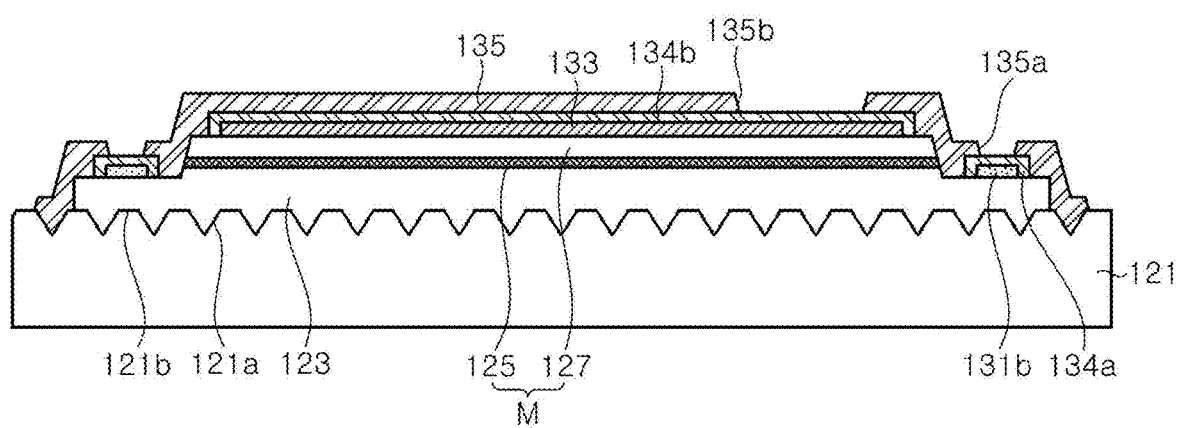

Referring to FIG. 18A and FIG. 18B, a lower insulation layer 135 covering the mesa M is formed. The lower insulation layer 135 covers side and upper surfaces of the mesa M. The lower insulation layer 135 also covers the n-capping layer 134a and the p-capping layer 134b. The lower insulation layer 135 may cover a side surface of the first conductivity type semiconductor layer 123, and may partially cover the substrate 121 exposed around the first conductivity type semiconductor layer 123. Meanwhile, the lower insulation layer 135 has openings 135a and 135b exposing the n-capping layer 134a and the p-capping layer 134b.

The opening 135a of the lower insulation layer 135 exposes the n-capping layer 134a, and the opening 135b exposes the p-capping layer 134b. A plurality of openings 135b may be formed on the p-capping layer 134b. As illustrated, the openings 135b may be symmetrically disposed on both sides of the groove 130g.

Figure 19A:
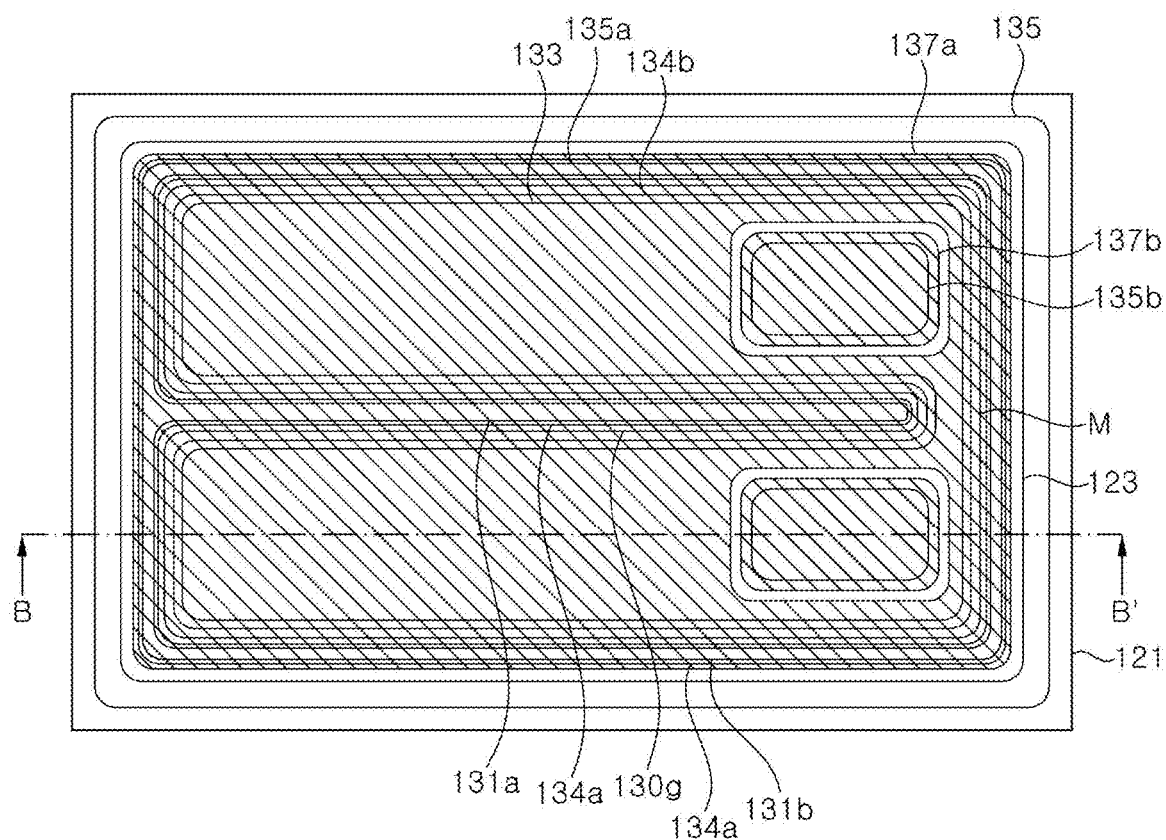
Figure 19B:
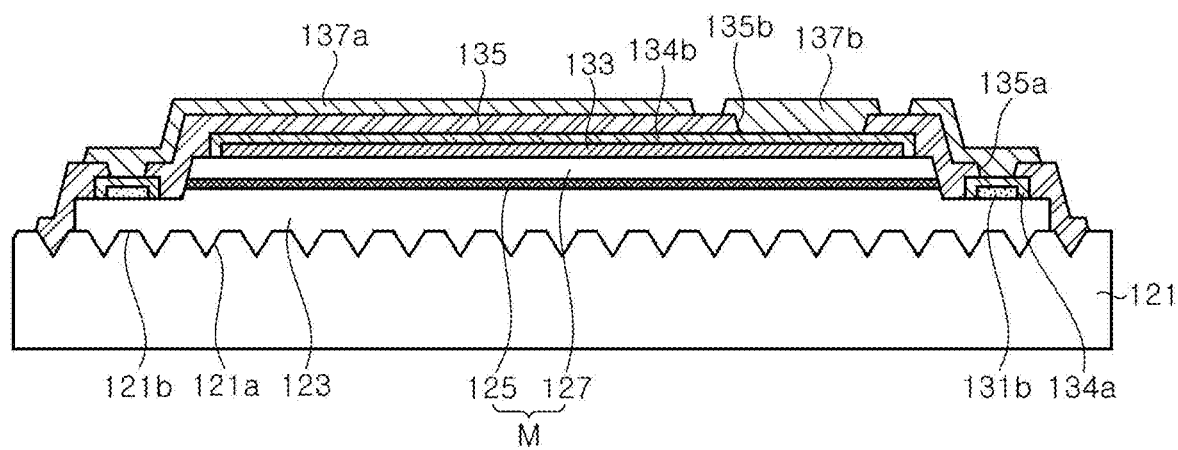

Referring to FIG. 19A and FIG. 19B, an n-pad metal layer 137a and a p-pad metal layer 137b are formed on the lower insulation layer 135. The n-pad metal layer 137a may be electrically connected to the n-capping layer 134a through the opening 135a, and the p-pad metal layer 137b may be electrically connected to the p-capping layer 134b through the opening 135b. As illustrated, the n-pad metal layer 137a may surround the p-pad metal layers 137b.

The n-pad metal layer 137a may cover the opening 135a, and the p-pad metal layer 137b may cover the opening 135b. In addition, the n-pad metal layer 137a may continuously cover the side surface of the mesa M, and thus, light reflectivity may be improved on the side surface of the mesa M.

Figure 20A:
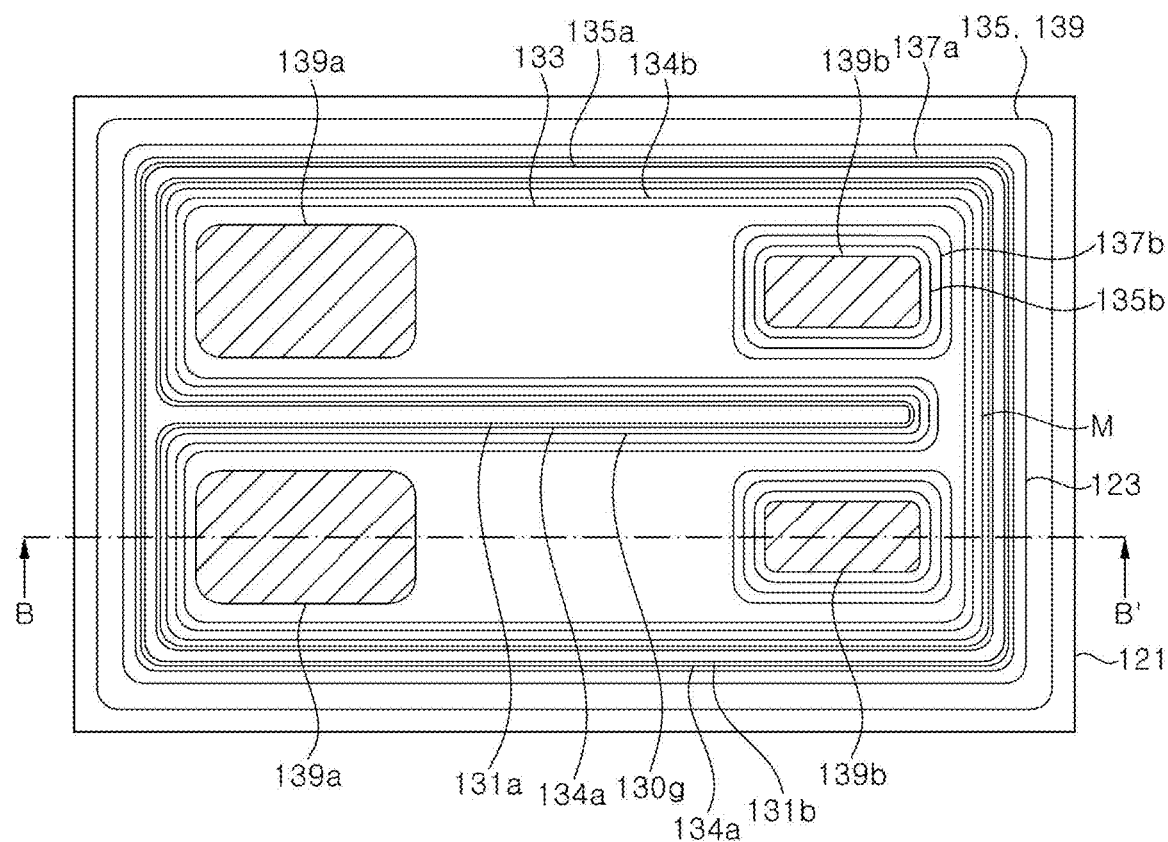
Figure 20B:
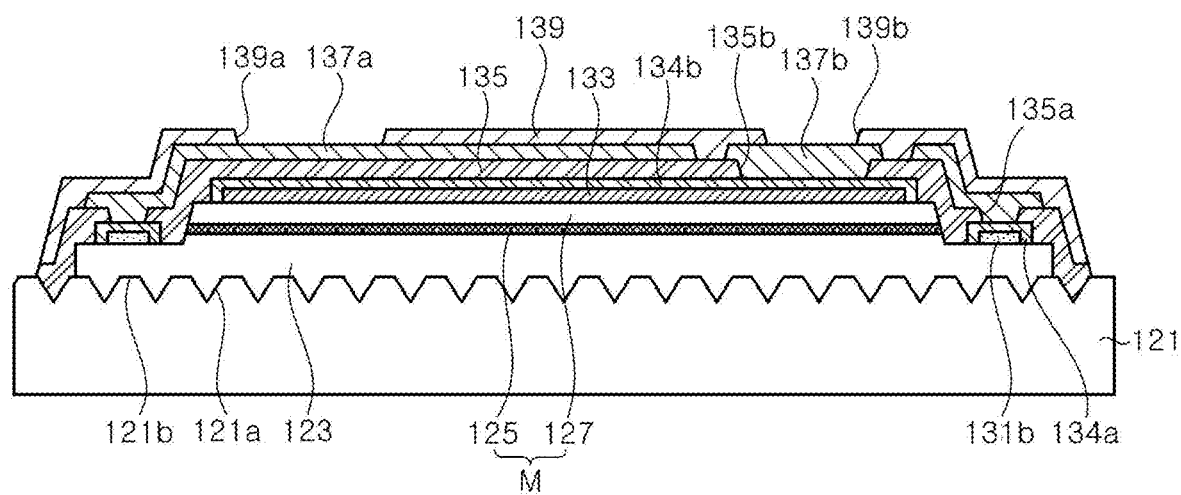

Referring to FIG. 20A and FIG. 20B, an upper insulation layer 139 is formed on the n-pad metal layer 137a and the p-pad metal layer 137b. The upper insulation layer 139 may cover the n-pad metal layer 137a and the p-pad metal layer 137b and may also cover an edge of the first conductivity type semiconductor layer 123. The upper insulation layer 139 may also cover a portion of the upper surface of the substrate 121.

The upper insulation layer 139 has openings 139a and 139b exposing the n-pad metal layer 137a and the p-pad metal layer 137b. The openings 139a expose the n-pad metal layer 137a, and the openings 139b expose the p-pad metal layer 137b. The openings 139a may be formed near one edge of the mesa M, and the openings 139b may be formed near an opposite edge of the mesa M to face the openings 139a.

Subsequently, as shown in FIGS. 12A and 12B, an n-bump 141a and a p-bump 141b are formed on the upper insulation layer 139. The n-bump 141a is electrically connected to the n-pad metal layer 137a through the openings 139a, and the p-bump 141b is electrically connected to the p-pad metal layer 137b through the opening 139b.

The n-bump 141a and p-bump 141b may partially cover the side surface of the mesa M, respectively, but may be formed to be limited in a region over the mesa M.

According to the illustrated exemplary embodiment, by forming the groove 130g within the mesa M region and forming the n-ohmic contact layers 131a and 131b around the mesa M and in the groove 130g, current may be uniformly spread over an entire region of the mesa M.

Figure 21:
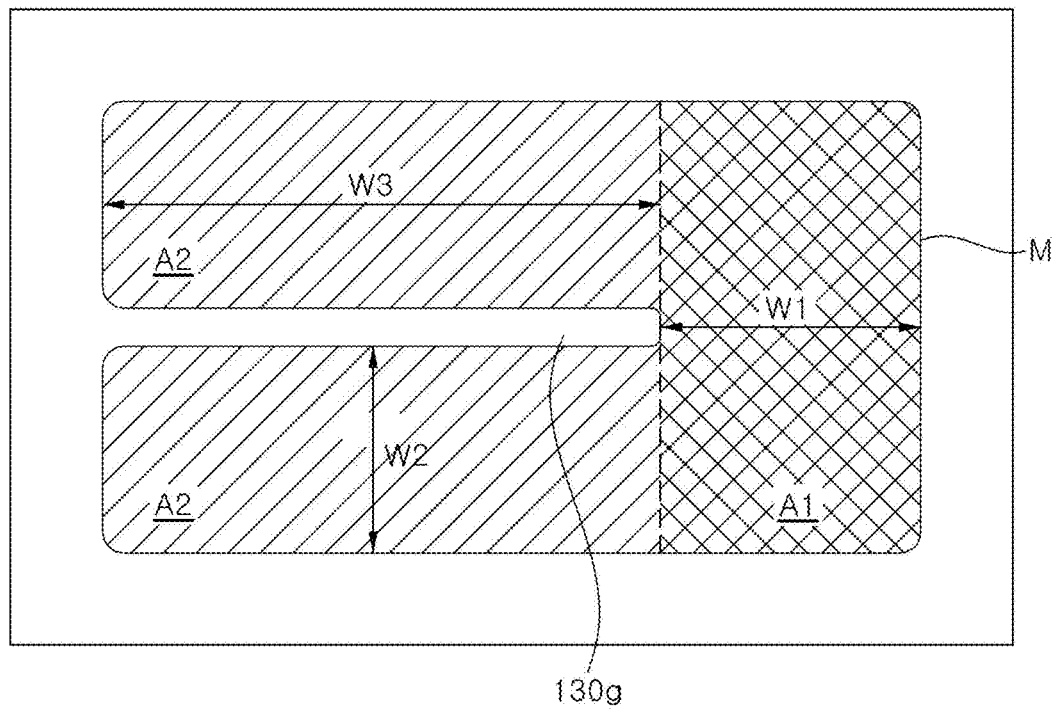
FIG. 21 is a schematic plan view illustrating a modified example of a mesa of a UV light emitting diode according to an exemplary embodiment of the present disclosure.

FIG. 21 is a schematic plan view illustrating a modified example of a mesa of a UV light emitting diode according to an exemplary embodiment of the present disclosure.

Referring to FIG. 21, a groove 130g extends from one edge of the mesa M toward an opposite edge in a longitudinal direction. A distance between an inner end of the groove 130g and the opposite edge of the mesa M, that is, a difference W1 between a total length of the mesa M and a length of the groove 130g may be less than or equal to a width W2 of each mesa region which is disposed on both sides of the groove 130g. Moreover, the length of the groove 130g is greater than W1, and thus, exceeds ½ of the length of the mesa M. Meanwhile, an area A1 of the mesa M between the groove 130g and the opposite edge of the mesa M may be smaller than an area A2 of each mesa region disposed on both sides of the mesa M. That is, a total area 2A2 of the mesa regions disposed on both sides of the mesa M may exceed ½ of a total area of the mesa.

Figure 22:
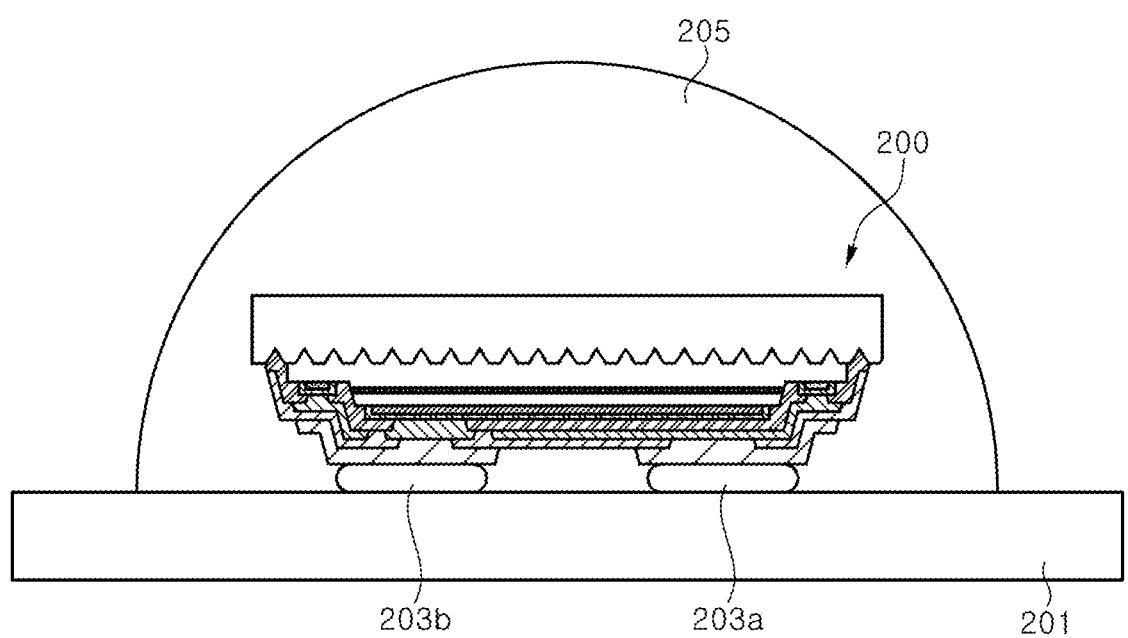
FIG. 22 is a schematic cross-sectional view illustrating a light emitting module according to an exemplary embodiment of the present disclosure.

FIG. 22 is a schematic cross-sectional view illustrating a light emitting module according to an exemplary embodiment of the present disclosure.

Referring to FIG. 22, the light emitting module may include a circuit board 201, a light emitting diode 200, bonding layers 203a and 203b, and a cover 205. Since the light emitting diode 200 is identical to the light emitting diode described with reference to FIGS. 12A and 12B, a detailed description thereof will be omitted. The light emitting diode 100 described with reference to FIGS. 1A and 1B may be used.

The light emitting diode 200 may be flip-bonded on the circuit board 201 such that the substrate 121 is disposed on an upper surface thereof to form a light exiting surface. The light emitting diode 200 may be bonded to the circuit board 201 through the bonding layers 203a and 203b.

The cover 205 covers the light emitting diode 200. The cover 205 may be formed of a material having transmittance to ultraviolet rays. The cover 205 in a form of quartz or glass may be disposed over to be spaced apart from the light emitting diode 200, or in contrast, as shown in FIG. 22, the cover 205 formed of a silicone material may be disposed to cover upper and side surfaces of the light emitting diode 200. When the silicone material is used, an external shape may be a dome-type shape having a curved surface so as to facilitate light extraction. To prevent damage to the silicone material by ultraviolet rays, the silicone material may be a fluorine-based material, and may include a carbon material together. A content of fluorine compared to carbon may be in a range of 10-35 atomic %: 65-90 atomic %, and in a case of having such a fluorine content, it is possible to effectively extract 200 nm to 300 nm of UV light while maintaining an effect of preventing silicone damage. In the above case, since an active layer 125 generating UV light is disposed closer to a flat surface 121b of a substrate 121, a possibility of light first contacting and entering the flat surface 121b increases. Accordingly, a decrease in luminous intensity due to scattering of light generated at a boundary between the substrate 121 and the semiconductor layer is prevented, and the light extraction efficiency is increased.

EXAMPLE

According to the prior art, a UV light emitting diode of a Comparative Example was manufactured using a flat sapphire substrate having no hole pattern as a growth substrate, and, a UV light emitting diode of an Inventive Example was manufactured using a sapphire substrate having a hole pattern as a growth substrate. Both Comparative Example and Inventive Example were fabricated using 2-inch wafers. In an exemplary embodiment, a hole pattern was formed with a target that a diameter of the hole (D2) was 800 nm (±40 nm), and a depth of the hole was 200 nm (±50 nm). For the Comparative Example, five samples fabricated on a same wafer were prepared, and for the Inventive Example, nine samples fabricated on a same wafer were prepared. The samples of these Comparative Example and Inventive Example were driven at room temperature for 1000 hours to measure changes of light outputs, threshold voltages, and turn-on voltages over time with respect to an initial light output. The initial light output means radiant power measured within 24 hours after driving the samples. The initial light output was expressed as 100%, and the changes over time at 250-hour intervals were summarized in Tables 1 and 2 below as a percentage of an initial value. The initial light outputs and turn-on voltages of the samples of the Inventive Example were relatively higher than those of the samples of the Comparative Example, and the initial threshold voltages of the samples of the Inventive Example were relatively lower than those of the samples of the Comparative Example.

TABLE 1

|  |  | 250 hours | | | 500 hours | | |
|---|---|---|---|---|---|---|---|
|  | No | PO | VF | TOV(@1 uA) | PO | VF | TOV(@1 uA) |
| Inventive Example | 1 | 98.2% | 98.4% | 99.4% | 98.9% | 98.2% | 98.9% |
|  | 2 | 96.4% | 96.9% | 98.7% | 95.4% | 96.7% | 98.3% |
|  | 3 | 91.5% | 96.7% | 97.4% | 91.5% | 96.6% | 96.8% |
|  | 4 | 89.7% | 96.2% | 91.8% | 89.2% | 95.9% | 93.2% |
|  | 5 | 95.8% | 97.7% | 96.3% | 95.2% | 97.6% | 95.6% |
|  | 6 | 97.0% | 96.9% | 99.8% | 96.0% | 96.7% | 99.7% |
|  | 7 | 90.5% | 98.2% | 100.1% | 89.9% | 98.0% | 99.9% |
|  | 8 | 94.5% | 97.0% | 99.9% | 92.9% | 96.9% | 99.8% |
|  | 9 | 94.3% | 100.0% | 98.9% | 94.2% | 97.7% | 98.4$ |
| Average |  | 94.2% | 97.6% | 98.0% | 93.7% | 97.1% | 97.8% |
| Minimum |  | 89.7% | 96.2% | 98.0% | 89.2% | 95.9% | 93.2% |
| Maximum |  | 98.2% | 100.0% | 91.8% | 98.9% | 98.2% | 99.9% |
| Comparative Example | 1 | 89.6% | 95.8% | 100.1% | 86.1% | 95.6% | 100.9% |
|  | 2 | 85.8% | 95.8% | 100.9% | 78.8% | 95.6% | 100.8% |
|  | 3 | 86.7% | 95.8% | 100.9% | 81.2% | 95.6% | 101.0% |
|  | 4 | 85.5% | 95.7% | 100.7% | 78.7% | 95.5% | 100.8% |
|  | 5 | 84.1% | 95.8% | 100.9% | 77.5% | 95.7% | 100.8% |
| Average |  | 86.3% | 95.8% | 100.8% | 80.5% | 95.6% | 100.9% |
| Minimum |  | 84.1% | 95.7% | 100.7% | 77.5% | 95.5% | 100.8% |
| Maximum |  | 89.6% | 95.8% | 100.9% | 86.1% | 95.7% | 101.0% |

TABLE 2

|  |  | 750 hours | | | 1000 hours | | |
|---|---|---|---|---|---|---|---|
|  | No | PO | VF | TOV(@ 1 uA) | PO | VF | TOV(@1 uA) |
| Inventive Example | 1 | 96.4% | 98.2% | 98.5% | 95.9% | 98.2% | 98.6% |
|  | 2 | 94.2% | 96.7% | 98.2% | 94.5% | 96.7% | 97.5% |
|  | 3 | 89.5% | 96.6% | 95.5% | 90.0% | 96.7% | 95.9% |

TABLE 2-continued

| | No | 750 hours | | | 1000 hours | | |
|---|---|---|---|---|---|---|---|
| | | PO | VF | TOV(@ 1 uA) | PO | VF | TOV(@1 uA) |
| | 4 | 87.3% | 95.9% | 93.3% | 87.4% | 96.0% | 94.2% |
| | 5 | 93.2% | 97.6% | 95.2% | 93.2% | 97.7% | 95.2% |
| | 6 | 93.9% | 96.6% | 99.5% | 95.0% | 96.7% | 99.5% |
| | 7 | 88.9% | 98.1% | 99.8% | 89.5% | 98.0% | 99.9% |
| | 8 | 92.0% | 96.8% | 99.5% | 92.4% | 96.9% | 99.5% |
| | 9 | 92.1% | 97.7% | 98.0% | 92.8% | 97.8% | 98.0% |
| Average | | 91.9% | 97.1% | 97.5% | 92.3% | 97.2% | 97.6% |
| Minimum | | 87.3% | 95.9% | 93.3% | 87.4% | 96.0% | 94.2% |
| Maximum | | 96.4% | 98.2% | 99.8% | 95.9% | 98.2% | 99.9% |
| Comparative | 1 | 84.8% | 95.7% | 101.0% | 81.9% | 95.7% | 101.0% |
| Example | 2 | 78.6% | 95.7% | 100.9% | 78.6% | 95.7% | 101.0% |
| | 3 | 80.6% | 95.7% | 101.2% | 79.3% | 95.7% | 101.1% |
| | 4 | 78.3% | 95.6% | 94.7% | 77.5&  | 95.6% | 19.7% |
| | 5 | 77.3% | 95.7% | 101.1% | 77.1% | 95.7% | 101.2% |
| Average | | 79.9% | 95.7% | 99.7% | 78.9% | 95.7% | 84.8% |
| Minimum | | 77.3% | 95.6% | 94.7% | 77.1% | 95.6% | 19.7% |
| Maximum | | 84.8% | 95.7% | 101.2% | 81.9% | 95.7% | 101.2% |

Referring to Tables 1 and 2, the samples of the Inventive Example exhibited light output of 85% or more compared to the initial value after driving for 1000 hours, and most of them exhibited light output of 90% or more. Among the samples, the light output of the sample showing a minimum value after driving for 1000 hours was 87.4% compared to the initial value. In contrast, the samples of Comparative Example exhibited the light output of less than 85% compared to the initial value after 1000 hours of driving, and most of them exhibited the light output of 80% or less. Among the samples of Comparative Example, the light output of the sample showing a maximum value after 1000 hours of driving was 81.9% compared to the initial value.

The threshold voltages of the samples of the Inventive Example were also maintained closer to the initial value than the samples of the Comparative Example after driving for 1000 hours. Meanwhile, the turn-on voltages of the samples of the Comparative Example were generally increased after driving for 1000 hours, and the turn-on voltage of Sample 4 was sharply decreased after driving for 1000 hours.

As a result of the driving test of the samples of the Comparative Example and the Inventive Example, it is understood that the samples of the Inventive Example to which the hole pattern is added have the high initial light outputs and well maintain the light outputs even after driving for a long time.

Although some exemplary embodiments have been described herein, it should be understood that the above exemplary embodiments may be variously modified and changed without departing from the spirit and scope of the present disclosure, and the present disclosure includes all of the broad scope of the appended claims.

The invention claimed is:

1. A UV light emitting diode, comprising:
a substrate having a plurality of holes surrounded by a flat surface, wherein at least one of the plurality of holes has a curved bottom surface;
a first conductivity type semiconductor layer disposed on the substrate;
a second conductivity type semiconductor layer disposed above the first conductivity type semiconductor layer; and
an active layer disposed between the first conductivity type semiconductor layer and the second conductivity type semiconductor layer, wherein a distance from the flat surface to the active layer is smaller than a distance from a bottom point or a bottom surface of the plurality of holes to the active layer, and the flat surface is in contact with the first conductivity type semiconductor layer.

2. The UV light emitting diode of claim 1, wherein at least one of the plurality of holes includes an inlet having a diameter of less than 1 μm.

3. The UV light emitting diode of claim 1, wherein a distance between centers of two adjacent holes among the plurality of holes range from 1 μm to 3 μm.

4. The UV light emitting diode of claim 1, wherein:
the substrate further includes a light exiting surface disposed opposite to the flat surface and emitting light to an outside of the UV light emitting diode,
at least one of the plurality of holes including inclined surfaces, and
the inclined surfaces of the at least one of the plurality of holes are disposed between the flat surface of the substrate and the light exiting surface.

5. The UV light emitting diode of claim 1, wherein:
the first conductivity type semiconductor layer includes a plurality of cavities therein, and
the plurality of cavities corresponds to and is disposed in locations vertically overlapped with regions of the plurality of holes, and
wherein a maximum width of each of the plurality of cavities is less than a maximum width of a corresponding hole.

6. The UV light emitting diode of claim 5, wherein:
the first conductivity type semiconductor layer includes an AlN layer, and
the plurality of cavities is formed in the AlN layer.

7. The UV light emitting diode of claim 1, further comprising:
an n-ohmic contact layer disposed in a via hole and contacting the first conductivity type semiconductor layer;
a p-ohmic contact layer contacting the second conductivity type semiconductor layer;
an n-pad metal layer electrically connected to the n-ohmic contact layer;
a p-pad metal layer electrically connected to the p-ohmic contact layer;
an n-bump electrically connected to the n-pad metal layer; and a p-bump electrically connected to the p-pad metal layer, wherein the p-pad metal layer is formed so as to surround the n-pad metal layer.

8. The UV light emitting diode of claim 7, wherein the n-bump and the p-bump are disposed in a region over the second conductivity type semiconductor layer.

9. The UV light emitting diode of claim 7, further comprising:
a lower insulation layer covering the p-ohmic contact layer and the n-ohmic contact layer, wherein:
the lower insulation layer has openings exposing the p-ohmic contact layer and the n-ohmic contact layer, and
the n-pad metal layer and the p-pad metal layer are electrically connected to the n-ohmic contact layer and the p-ohmic contact layer through the first openings of the lower insulation layer, respectively.

10. The UV light emitting diode of claim 7, further comprising:
an upper insulation layer covering the n-pad metal layer and p-pad metal layer, wherein the upper insulation layer has second openings exposing the n-pad metal layer and the p-pad metal layer,
wherein the n-bump and the p-bump are disposed on the upper insulation layer, and electrically connected to the n-pad metal layer and the p-pad metal layer through the second openings of the upper insulation layer.

11. The UV light emitting diode of claim 7, wherein:
a peak wavelength of an emission spectrum is 280 nm or less, and
after driving at room temperature for 1000 hours, a light output is 85% or more compared to an initial light output.

12. The UV light emitting diode of claim 11, the light output of the UV light emitting diode after driving at room temperature for 1000 hours is greater than or equal to 90% of the initial light output.

13. A UV light emitting diode, comprising:
a substrate having a flat surface, the flat surface having a plurality of holes, wherein at least one of the plurality of holes has a curved bottom surface;
a first conductivity type semiconductor layer disposed on the substrate and in contact with the flat surface;
an active layer disposed on the first conductivity type semiconductor layer;
a second conductivity type semiconductor layer disposed on the active layer;
an n-ohmic contact layer contacting the first conductivity type semiconductor layer;
a p-ohmic contact layer contacting the second conductivity type semiconductor layer;
an n-bump electrically connected to the n-ohmic contact layer; and
a p-bump electrically connected to the p-ohmic contact layer, wherein the substrate has a hole pattern.

14. The UV light emitting diode of claim 13, wherein:
the first conductivity type semiconductor layer includes a plurality of cavities therein, and
the first conductivity type semiconductor layer further includes an AlN layer, and
the plurality of cavities is formed in the AlN layer.

15. The UV light emitting diode of claim 14, further comprising a plurality of holes,
wherein the plurality of cavities is disposed in locations vertically overlapped with regions of the plurality of holes corresponding to the hole pattern, and
wherein a maximum width of each of the plurality of cavities is less than a maximum width of a corresponding hole.

16. The UV light emitting diode of claim 15, wherein at least one of the plurality of cavities includes a lower cavity and an upper cavity and at least a portion of the lower cavity is disposed in at least one of the plurality of holes and the upper cavity is disposed above the flat surface.

17. The UV light emitting diode of claim 13, wherein:
the second conductivity type semiconductor layer includes a p-type GaN layer, and
the p-type GaN layer has a thickness of 50 nm or less, and
the p-ohmic contact layer is in-ohmic contact with the p-type GaN layer.

18. The UV light emitting diode of claim 13, further comprising:
an upper insulation layer covering the n-ohmic contact layer and the p-ohmic contact layer, wherein the upper insulation layer has openings exposing the n-ohmic contact layer and the p-ohmic contact layer,
wherein the n-bump and the p-bump are electrically connected to the n-ohmic contact-layer and the p-ohmic contact layer through the openings of the upper insulation layer, respectively.

19. The UV light emitting diode of claim 18, wherein the upper insulation layer covers side surfaces of the second conductivity type semiconductor layer and the active layer.

20. The UV light emitting diode of claim 18, wherein the openings further comprise:
a first opening exposing the n-ohmic contact layer is disposed near one edge of a mesa, and
a second opening exposing the p-ohmic contact layer is disposed near an opposite edge of the mesa.

* * * * *